(12) United States Patent
Tang et al.

(10) Patent No.: US 9,711,396 B2
(45) Date of Patent: Jul. 18, 2017

(54) METHOD FOR FORMING METAL CHALCOGENIDE THIN FILMS ON A SEMICONDUCTOR DEVICE

(71) Applicant: ASM IP Holding B.V., Almere (NL)

(72) Inventors: Fu Tang, Gilbert, AZ (US); Michael Eugene Givens, Phoenix, AZ (US); Jacob Huffman Woodruff, Scottsdale, AZ (US); Qi Xie, Leuven (BE); Jan Willem Maes, Wilrijk (BE)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 14/741,249

(22) Filed: Jun. 16, 2015

(65) Prior Publication Data

US 2016/0372365 A1 Dec. 22, 2016

(51) Int. Cl.
*H01L 21/768* (2006.01)
*H01L 21/02* (2006.01)

(52) U.S. Cl.
CPC .... *H01L 21/76829* (2013.01); *H01L 21/0228* (2013.01); *H01L 21/02175* (2013.01); *H01L 21/02186* (2013.01); *H01L 21/02304* (2013.01); *H01L 21/76895* (2013.01)

(58) Field of Classification Search
None
See application file for complete search history.

(56) References Cited

U.S. PATENT DOCUMENTS

| | | | |
|---|---|---|---|
| 4,354,198 A | 10/1982 | Hodgson et al. | |
| 4,751,200 A | 6/1988 | Gmitter et al. | |
| 5,124,278 A | 6/1992 | Bohling et al. | |
| 5,168,077 A | 12/1992 | Ashizawa et al. | |
| 5,393,680 A | 2/1995 | Shikata | |

(Continued)

FOREIGN PATENT DOCUMENTS

| | | |
|---|---|---|
| EP | 0 265 314 A1 | 4/1988 |
| EP | 2 068 368 A2 | 6/2009 |

(Continued)

OTHER PUBLICATIONS

International Search Reporting for International Application No. PCT/US2014/066316, Notification mailed Mar. 3, 2015.

(Continued)

*Primary Examiner* — Charles Garber
*Assistant Examiner* — Steven Christopher
(74) *Attorney, Agent, or Firm* — Knobbe Martens Olson & Bear LLP

(57) ABSTRACT

In some aspects, methods of forming a metal chalcogenide thin film are provided. According to some methods, a metal chalcogenide thin film is deposited on a substrate in a reaction space in a cyclical deposition process where at least one cycle includes alternately and sequentially contacting the substrate with a first vapor-phase metal reactant and a second vapor-phase chalcogen reactant. In some aspects, methods of forming three-dimensional structure on a substrate surface are provided. In some embodiments, the method includes forming a metal chalcogenide dielectric layer between a substrate and a conductive layer. In some embodiments the method includes forming an MIS-type contact structure including a metal chalcogenide dielectric layer.

20 Claims, 4 Drawing Sheets

(56) References Cited

U.S. PATENT DOCUMENTS

| | | | |
|---|---|---|---|
| 5,451,542 A | 9/1995 | Ashby | |
| 5,616,947 A * | 4/1997 | Tamura | H01L 21/28264 257/289 |
| 5,646,419 A | 7/1997 | McCaldin et al. | |
| 5,760,462 A | 6/1998 | Barron et al. | |
| 6,071,780 A | 6/2000 | Okamoto et al. | |
| 6,112,013 A | 8/2000 | Hsiao et al. | |
| 6,117,720 A | 9/2000 | Harshfield | |
| 6,150,253 A | 11/2000 | Doan et al. | |
| 6,207,976 B1 | 3/2001 | Takahashi et al. | |
| 6,248,605 B1 * | 6/2001 | Harkonen | C09K 11/7718 313/503 |
| 6,380,097 B1 | 4/2002 | Dauplaise et al. | |
| 6,445,015 B1 | 9/2002 | Braddock | |
| 6,534,368 B2 | 3/2003 | Zahorik | |
| 6,635,951 B1 | 10/2003 | Zahorik | |
| 6,670,651 B1 | 12/2003 | Braddock | |
| 6,709,958 B2 | 3/2004 | Li et al. | |
| 6,710,423 B2 | 3/2004 | Moore et al. | |
| 6,727,192 B2 | 4/2004 | Moore et al. | |
| 6,730,547 B2 | 5/2004 | Li et al. | |
| 6,734,455 B2 | 5/2004 | Li | |
| 6,791,125 B2 * | 9/2004 | Demkov | H01L 29/517 257/192 |
| 6,812,087 B2 | 11/2004 | Giltom et al. | |
| 7,094,651 B2 | 8/2006 | Mitzi et al. | |
| 7,094,700 B2 | 8/2006 | Li et al. | |
| 7,307,277 B2 | 12/2007 | Frey et al. | |
| 7,341,960 B2 | 3/2008 | Lee et al. | |
| 7,394,088 B2 | 7/2008 | Lung | |
| 7,619,248 B1 | 11/2009 | Cleeves | |
| 7,678,708 B2 | 3/2010 | Vaartstra et al. | |
| 7,964,490 B2 | 6/2011 | Clendenning et al. | |
| 7,972,898 B2 | 7/2011 | Cowdery-Corvan et al. | |
| 8,368,135 B2 * | 2/2013 | Chau | H01L 29/66628 257/213 |
| 8,766,330 B2 | 7/2014 | Paranjape et al. | |
| 8,796,125 B2 | 8/2014 | Rockenberger et al. | |
| 9,245,742 B2 | 1/2016 | Haukka et al. | |
| 9,461,134 B1 * | 10/2016 | Xie | H01L 29/45 |
| 9,478,419 B2 | 10/2016 | Haukka et al. | |
| 2002/0041931 A1 | 4/2002 | Suntola et al. | |
| 2002/0106849 A1 | 8/2002 | Moore | |
| 2005/0257824 A1 | 11/2005 | Maltby et al. | |
| 2007/0111429 A1 | 5/2007 | Lung | |
| 2008/0006930 A1 | 1/2008 | Ichida | |
| 2008/0083924 A1 | 4/2008 | Song et al. | |
| 2008/0272355 A1 | 11/2008 | Cho et al. | |
| 2009/0179254 A1 | 7/2009 | Van Schaijk et al. | |
| 2010/0059820 A1 * | 3/2010 | Ohmi | H01L 29/4908 257/347 |
| 2010/0072451 A1 | 3/2010 | Terao et al. | |
| 2010/0159135 A1 | 6/2010 | Bent et al. | |
| 2010/0203672 A1 | 8/2010 | Eun et al. | |
| 2010/0291299 A1 * | 11/2010 | Cameron | C07F 17/00 427/255.6 |
| 2010/0300524 A1 | 12/2010 | Martinson et al. | |
| 2011/0006354 A1 | 1/2011 | Jangjian et al. | |
| 2011/0124141 A1 | 5/2011 | Goeoetz et al. | |
| 2011/0147795 A1 | 6/2011 | Rachmady et al. | |
| 2011/0156174 A1 * | 6/2011 | Dewey | H01L 21/28088 257/411 |
| 2013/0157405 A1 | 6/2013 | Cao et al. | |
| 2013/0270505 A1 | 10/2013 | Dahmani | |
| 2014/0027884 A1 | 1/2014 | Tang et al. | |
| 2014/0120738 A1 | 5/2014 | Jung et al. | |
| 2015/0200308 A1 * | 7/2015 | Karda | H01L 27/2454 257/329 |
| 2015/0340228 A1 | 11/2015 | Tapily et al. | |
| 2016/0203974 A1 | 7/2016 | Haukka et al. | |

FOREIGN PATENT DOCUMENTS

| | | |
|---|---|---|
| JP | 3-278584 | 12/1991 |
| KR | 10-2004-0038514 | 5/2004 |
| WO | WO 97/48499 | 12/1997 |
| WO | WO 02/15285 A1 | 2/2002 |
| WO | WO 03/019691 A2 | 3/2003 |
| WO | WO 2004/032242 A1 | 4/2004 |

OTHER PUBLICATIONS

Alian, et al., "Ammonium sulfide vapor passivation of / $In_{0.53}Ga_{0.47}As$ and InP surfaces," Applied Physics Letters, vol. 99, Issue 11, pp. 112114-112114-3, Sep. 2011.

Alian, et al., "Oxide trapping in InGaAs—$Al_2O_3$ system and the role of sulfur in reducing the $Al_2O_3$ trap density," Electron Device Letters, vol. 33, Issue 11, pp. 1544-1546, Sep. 21, 2012.

Brennan, B.Sc., "Surface and interface characterization of high-k dielectric materials on silicon and III-V semiconductor substrates," Dublin City University, School of Physical Sciences, Dec. 2009.

Genevee, et al. "Atomic layer deposition of zinc indium sulfide films: Mechanistic studies and evidence of surface exchange reactions and diffusion processes," Journal of Vacuum Science & Technology A., vol. 31, Issue 1, Jan./Feb. 2013.

Hsueh, C., "Alternative Materials for Next-Generation Transistors: High-k/Ge based MOSFET", A dissertation submitted to the Graduate School-New Brunswick Rutgers, 2008, 139 pages.

Ihanus, et al., "Atomic Layer Deposition of SrS and BaS Thin Films Using Cyclopentadienyl Precursors," Chemistry of Materials, vol. 14, Issue 5, pp. 1937-1944, May 2002.

Kukli, et al., "Controlled Growth of Yttrium Oxysulphide Thin Films by Atomic Layer Deposition," Materials Science Forum, vols. 315-317, pp. 216-221, dated 1999.

Leskela et al., "Atomic layer deposition (ALD): from precursors to thin film structures", Thin Solid Firms, vol. 409, (2002), pp. 138-146.

Lin, J., "Low Resistance Contacts to N-Type Germanium", A dissertation submitted to the Department of Electrical Engineering, Jun. 2013, 136 pages.

Misra, "High k dielectrics on High-Mobility Substrates: The Interface!" The Electrochemical Society, pp. 47-51, Winter 2011.

O'Connor, et al., "A systematic study of $(NH_4)_2S$ passivation (22%, 10%, 5%, or 1%) on the interface properties of $Al_2O_3$/ $In_{0.53}Ga_{0.47}As$/ InP system for n-type and p-type $In_{0.53}Ga_{0.47}As$ epitaxial layers," Journal of Applied Physics, vol. 109, Issue 2, pp. 024101-024101-10, dated 2011.

O'Connor, et. al., "Analysis of the minority carrier response of n-type and p-type Au/ Ni/ Al2O3/In0.53Ga0.47/InP capacitors following an optimized (NH4)2S treatment," Applied Physicas Letters, vol. 99, Issue 21, pp. 212901-212901-3, dated 2011.

International Search Report and Written Opinion for International Application No. PCT/US2014/066310, Notification mailed Sep. 2, 2015.

* cited by examiner

METHOD FOR FORMING METAL CHALCOGENIDE THIN FILMS ON A SEMICONDUCTOR DEVICE

BACKGROUND OF THE INVENTION

Field of the Invention

The invention relates generally to the field of semiconductor device manufacturing and, more particularly, to metal chalcogenide thin films and methods for forming the same, such as by atomic layer deposition ("ALD") processes. For example, metal chalcogenide thin films may be formed by ALD processes and may serve as a dielectric layer in a metal-insulator-semiconductor (MIS) structure.

Description of the Related Art

As the dimensions of semiconductor devices in integrated circuits become ever smaller, the sizes of the constituent parts of these devices are also becoming smaller. For example, the sizes of transistors are continually decreasing, leading to decreases in the sizes of transistor source/drain regions. These smaller source/drain regions provide a smaller contact area for the source/drain contacts that electrically connect the source/drain regions to other electrical features. Smaller contact areas, however, can cause undesirable increases in contact resistance. Consequently, there is a need for methods of forming source/drain contact structures with low contact resistance.

SUMMARY OF THE INVENTION

In some aspects, methods of forming metal chalcogenide thin films are provided. According to some methods, a metal chalcogenide thin film is deposited on a substrate in a reaction space in a cyclical process where at least one cycles includes alternately and sequentially contacting the substrate with a vapor phase first metal precursor and a second vapor phase chalcogen precursor. In some embodiments the metal reactant comprises a metal selected from the group consisting of Mg, Sr, Be, Ca, Ba, Ni, Zn, Cd, and In.

In some embodiments, methods for forming a metal chalcogenide thin film include removing excess vapor phase metal precursor and reaction byproducts from the substrate after contacting the substrate with the first vapor phase metal precursor. In some embodiments, methods for forming a metal chalcogenide thin film include removing excess vapor phase second chalcogen precursor and reaction byproducts from the substrate after contacting the substrate with a second vapor phase chalcogen precursor. In some embodiments the second precursor contacts the substrate before the first precursor contacts the substrate in at least one deposition cycle.

According to some embodiments, a metal chalcogenide film is formed using metal precursor having at least one cyclopentadienyl ligand. In some embodiments the metal of the metal chalcogenide thin film is magnesium (Mg). In some embodiments the metal precursor is $Mg(Cp)_2$ or a derivative thereof. In some embodiments the metal of the metal chalcogenide thin film is strontium (Sr). In some embodiments the metal precursor is $Sr(Cp)_2$ or a derivative thereof.

According to some embodiments, methods for forming a metal chalcogenide thin film include using $H_2S$, $H_2Se$, or $H_2Te$ as a chalcogenide precursor. In some embodiments the chalcogenide precursor comprises $(NH_4)_2S$, $(NH_4)_2Se$, $(NH_4)_2Te$, elemental or atomic S, Se, Te, S-containing, Se-containing, or Te-containing plasma, or S-radical, Se-radicals, or Te-radicals. In some embodiments the resulting metal chalcogenide thin film comprises BeS, MgS, CaS, SrS, BaS, NiS, ZnS, CdS, InS, BeSe, MgSe, CaSe, SrSe, BaSe, NiSe, ZnSe, CdSe, InSe, BeTe, MgTe, CaTe, SrTe, BaTe, NiTe, ZnTe, CdTe, or InTe.

In some aspects, methods of forming metal-insulator-semiconductor (MIS) structure on a substrate surface are provided. In some embodiments, the methods comprise providing a substrate comprising a semiconductor surface, depositing a metal chalcogenide thin film over the semiconductor surface, and depositing a metal layer over the metal chalcogenide thin film. In some embodiments the metal of the metal chalcogenide thin film comprises at least one of the following: Mg, Sr, Be, Ca, Ba, Ni, Zn, Cd, and In. In some embodiments the chalcogen of the metal chalcogenide thin film comprises at least one of sulfur, selenium, and tellurium. In some embodiments the metal chalcogenide thin film has a thickness between about 0.1 nm and about 5 nm. In some embodiments the metal of the metal chalcogenide thin film comprises at least one of the following: Be, Mg, Ca, Ba, Sr, Y, Sc, La, Ce, Pr, Nd, Pm, Sm, Eu, Gd, Tb, Dy, Ho, Er, Tm, Yb, Lu, Al, Si, Ni, Zn, Cd, Pb, In, Ga, Ge, Gd, Ta, Mo, and W. In some embodiments the metal chalcogenide thin film comprises at least one of the following: BeS, MgS, CaS, SrS, BaS, NiS, ZnS, CdS, InS, BeSe, MgSe, CaSe, SrSe, BaSe, NiSe, ZnSe, CdSe, InSe, BeTe, MgTe, CaTe, SrTe, BaTe, NiTe, ZnTe, CdTe, and InTe. In some embodiments the semiconductor surface comprises silicon, silicon germanium, a group III-V semiconductor, a group II-VI semiconductor, a 2D semiconductor, or combinations thereof. In some embodiments the metal layer comprises at least one of the following: Ti, Al, Zr, Hf, V, Ta, Nb, Cr, Mo, W, Co, TiN, TiC, TiAlC, TaC, TaAlC, NbAlC, TiAl, TaAl, TaN, TaCN, WN, and TiWN.

In some aspects, methods of forming metal-insulator-semiconductor (MIS) structure on a substrate surface are provided. In some embodiments, the methods comprise forming a metal chalcogenide thin film on the substrate surface by an atomic layer deposition (ALD) process comprising alternately and sequentially contacting the substrate surface with a metal precursor and a chalcogen precursor, and forming a metal layer over the metal chalcogenide thin film. In some embodiments the metal precursor comprises at least one of the following metals: Mg, Sr, Be, Ca, Ba, Ni, Zn, Cd, and In. In some embodiments the chalcogen precursor is selected from at least one of the following: elemental S, elemental Se, elemental Te, S plasma, Se plasma, Te plasma, H2S, H2Se, H2Te, (NH4)2S, (NH4)2Se, and (NH4)2Te. In some embodiments the metal precursor comprises a cyclopentadienyl ligand. In some embodiments the metal precursor comprises $Mg(Cp)_2$ or $Sr(Cp)_2$. In some embodiments the methods further comprise subjecting the substrate surface to a pretreatment process prior to forming a metal chalcogenide thin film on the substrate surface using an ALD process, wherein the pretreatment process comprises exposing the substrate surface to at least one of the following: HCl, HF, HBr, $Cl_2$, HF, $H_2S$, $H_2Se$, $H_2Te$, $(NH_4)_2S$, $(NH_4)_2Se$, and $(NH_4)_2Te$. In some embodiments the metal chalcogenide thin film has a thickness between about 0.1 nm and about 5 nm. In some embodiments the metal chalcogenide thin film comprises at least one of the following materials: BeS, MgS, CaS, SrS, BaS, NiS, ZnS, CdS, InS, BeSe, MgSe, CaSe, SrSe, BaSe, NiSe, ZnSe, CdSe, InSe, BeTe, MgTe, CaTe, SrTe, BaTe, NiTe, ZnTe, CdTe, and InTe.

In some aspects methods for integrated circuit fabrication are provided. In some embodiments, the methods comprise forming a metal chalcogenide dielectric layer over a source/ drain region of a semiconductor substrate by alternately and sequentially contacting the substrate surface with a metal precursor and a chalcogen precursor, and forming a metal electrode over the dielectric layer. In some embodiments the metal chalcogenide thin film comprises at least one of the following materials: BeS, MgS, CaS, SrS, BaS, NiS, ZnS, CdS, InS, BeSe, MgSe, CaSe, SrSe, BaSe, NiSe, ZnSe, CdSe, InSe, BeTe, MgTe, CaTe, SrTe, BaTe, NiTe, ZnTe, CdTe, and InTe. In some embodiments the metal chalcogenide thin film comprises at least one of the following materials: MgS, SrS, MgSe, SrSe, MgTe, and SrTe. In some embodiments the metal electrode comprises at least one of the following: Ti, Al, Zr, Hf, V, Ta, Nb, Cr, Mo, W, Co, TiN, TiC, TiAlC, TaC, TaAC, NbAC, TiAl, TaAl, TaN, TaCN, WN, and TiWN. In some embodiments the metal electrode comprises titanium. In some embodiments the source/drain region comprises silicon, silicon germanium, a group III-V semiconductor, a group II-VI semiconductor, a 2D semiconductor, or combinations thereof. In some embodiments the source/drain region comprises germanium. In some embodiments the source/drain region comprises n-doped germanium, and the metal electrode comprises titanium. the metal precursor comprises $Mg(Cp)_2$ or $Sr(Cp)_2$, and the chalcogen precursor comprises $H_2S$, $H_2Se$, or $H_2Te$. In some embodiments the metal chalcogenide dielectric layer comprises MgS or SrS

BRIEF DESCRIPTION OF THE DRAWINGS

The invention will be better understood from the detailed description and from the appended drawings, which are meant to illustrate and not to limit the invention, and wherein.

DETAILED DESCRIPTION

Figure 1:
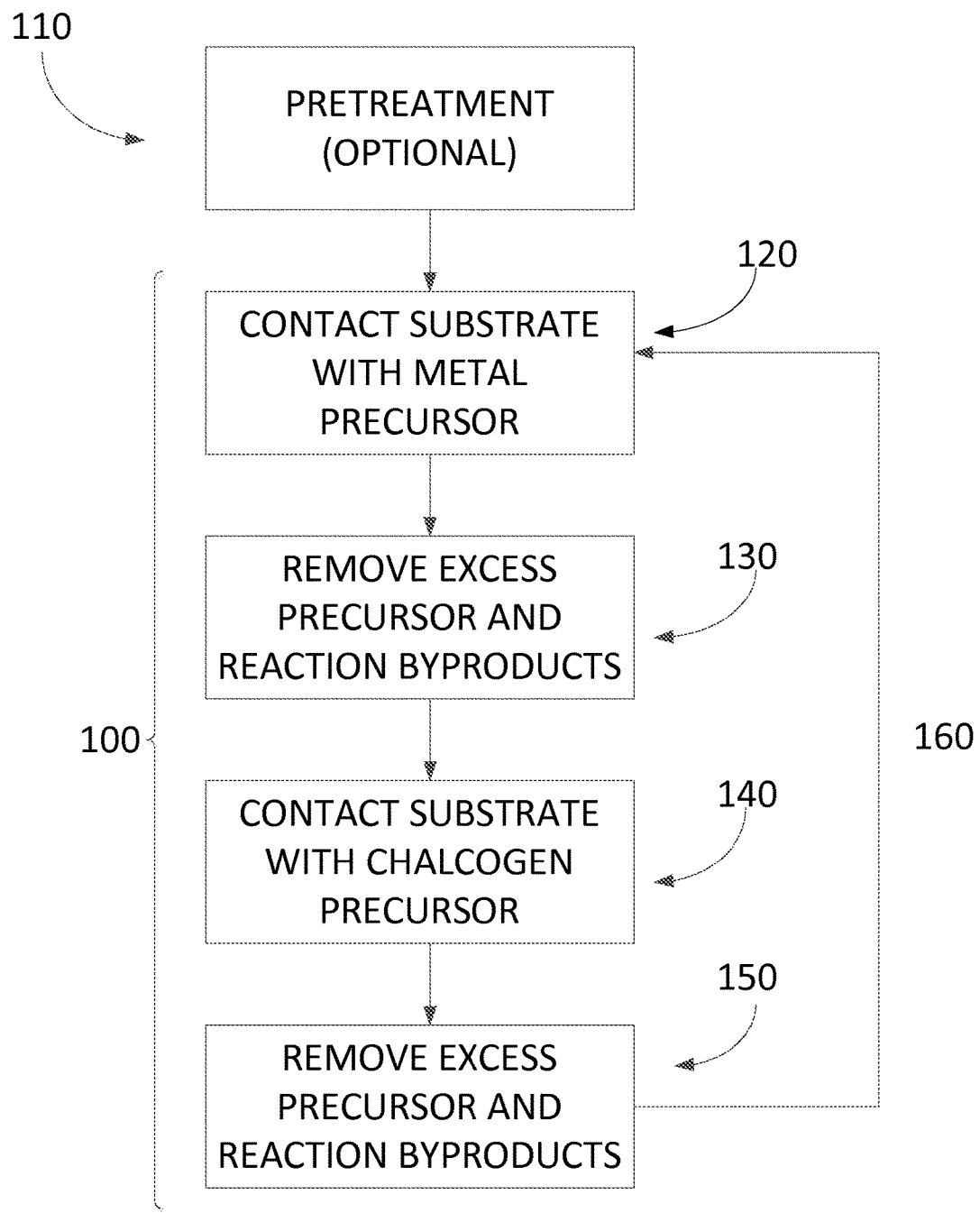
FIG. 1 is a flow chart illustrating an ALD process for forming a metal chalcogenide thin film according to some embodiments.

The contact resistance between a source/drain contact structure and a source/drain region can be reduced by reducing contact resistivity. Without being limited by theory, it is believed that one phenomenon causing high contact resistivity is Fermi level pinning at the semiconductor valence band edge. This Fermi level pinning is believed to occur for many of the source/drain contact metals used to contact the semiconductor that forms the source/drain regions. The result is a high Schottky Barrier Height (SBH). Consequently, decreasing Fermi level pinning is believed to provide one approach to reduce contact resistivity.

Metal-Insulator-Semiconductor (MIS) structures have been proposed as one way to accomplish Fermi level depinning. These MIS structures include a thin dielectric film serving as an electron tunneling barrier layer between the semiconductor material of the source/drain region and the metal contact, thereby typically forming a contact structure with a semiconductor (the source/drain region), a barrier layer over and in contact with the semiconductor, and a metal over and in contact with the barrier layer. The thin insulating film is believed to cause depinning of the Fermi level and a reduction of the SBH. The thin dielectric film also adds to the resistance between the semiconductor and the metal. Nevertheless, by reducing the SBH, an overall reduction in contact resistivity is obtained if the barrier layer is sufficiently thin.

It has been found, however, that MIS structures may still have an undesirably high SBH. For example, $TiO_2$ has been investigated as a barrier layer for these MIS structures since it exhibits negligible conduction band offset with respect to either Ge or Si. Preferably, the barrier layer of an MIS structure will exhibit a low band offset with respect to the semiconductor layer of the MIS structure. However, the SBH obtained in a $Al/TiO_2/n$-Ge MIS system was found to be about 0.45 eV, which is still higher than desired for some applications.

Metal oxide barrier layers may also create problems when used in an MIS structure. For example, metal oxide deposition may undesirably oxidize the underlying semiconductor surface, necessitating a passivation layer.

Chalcogen passivation of the semiconductor surface of the source/drain region has been proposed (e.g. Thathachary et al, APL 96 152108, 2010) as another approach for decreasing SBH. Without being limited by theory, it is believed that the chalcogen passivation also reduces the SBH by decreasing Fermi level pinning.

Chalcogen passivation of the semiconductor surface, however, can make formation of a source/drain structure difficult because the chalcogen passivation makes this surface highly inert and difficult to deposit material on. This difficulty can make the formation of MIS-type contact structures particularly challenging, since the quality (including the uniformity and thickness) of the barrier layer formed in contact with passivated surface has a direct impact on the electrical properties of the source structure.

In accordance with embodiments disclosed herein, source/drain contact structures may be formed having a low SBH. In some embodiments, an MIS-type contact structure is formed by depositing a metal chalcogenide thin film as a barrier layer by an atomic layer deposition (ALD) type process on a semiconductor surface. Optionally, the semiconductor surface may be pretreated prior to depositing the metal chalcogenide barrier layer. The metal chalcogenide thin film may then be optionally subjected to post-deposition treatment. A metal is subsequently deposited on the barrier layer, e.g., to form a metal electrode or electrical contact. Preferably, the MIS contact structure includes a metal that directly contacts the metal chalcogenide barrier layer, which in turn directly contacts the semiconductor surface of the source/drain region.

Advantageously, MIS contact structures formed according to some embodiments may have a reduced SBH. For example, the SBH may be about 0.11 eV or less (including about 0.07 eV to about 0.11 eV). Moreover, the metal chalcogenide barrier layers and methods of making the same disclosed herein may provide similar advantages to chalcogen-surface passivation, such as preventing or reducing the possible re-oxidation of the semiconductor surface due to later oxide growth. Additionally, a metal chalcogenide barrier layer as described herein may result in simplified integration due to the elimination of the need for an oxide barrier layer in addition to a metal chalcogenide passivation layer.

In some embodiments, metal chalcogenide thin films, methods of forming metal chalcogenide thin films and methods of forming three-dimensional structures incorporating metal chalcogenide thin films are provided. In some embodiments, the metal of the metal chalcogenide thin film may be selected from any number of metals, such as magnesium, strontium, beryllium, calcium, barium, nickel, zinc, cadmium, and indium. In some embodiments the chalcogen of the metal chalcogenide thin film may be selected from the group consisting of S, Se, and Te. For the purposes of the present disclosure oxygen will not be referred to herein as a chalcogen.

Atomic Layer Deposition ("ALD") of Metal Chalcogenide Thin Films

In some embodiments, methods for forming metal chalcogenide thin films comprise an ALD process. For example, a substrate may be alternately and sequentially contacted with a first reactant comprising metal (also referred to as a metal precursor) and a second reactant comprising a chalcogen (also referred to as a chalcogen precursor). The metal precursor may be selected to provide the desired metal in the metal chalcogenide dielectric or barrier layer. Thus, in some embodiments the metal reactant is selected to provide a metal that is different from a metal in the underlying substrate region and/or from a metal in a metal layer that is to be subsequently deposited. In some embodiments a metal chalcogenide thin film comprises one or more of the following metals: Be, Mg, Ca, Ba, Sr, Y, Sc, La, Ce, Pr, Nd, Pm, Sm, Eu, Gd, Tb, Dy, Ho, Er, Tm, Yb, Lu, Al, Si, Ni, Zn, Cd, Pb, In, Ga, Ge, Gd, Ta, Mo, and W.

In some embodiments, methods of forming a metal chalcogenide film comprise an ALD cycle in which a metal source chemical and a chalcogen source chemical are alternatively and sequentially pulsed into a reaction space comprising a substrate. The metal source chemical is provided to the reaction space where at least some of the metal source chemical contacts and adsorbs to the substrate surface. The chalcogen source chemical is subsequently provided to the reaction space and reacts with the adsorbed metal source chemical to form metal chalcogenide. In some embodiments, the chalcogen source chemical may precede the metal source chemical. In some such embodiments a chalcogen may bond to the substrate and the subsequent metal source chemical reacts with a deposited chalcogen, or a chalcogen source chemical may change or remove and replace the surface termination to chalcogen-$H_x$-groups or other surface species comprising a chalcogen.

Such an ALD cycle is repeated as desired to form a film of a desirable thickness. In some embodiments, the ALD cycle is repeated until a complete, closed layer of a metal chalcogenide is formed. In some embodiments, the ALD cycle is repeated until a physically continuous layer of a metal chalcogenide is formed. In some embodiments, the ALD cycle is repeated until a minimum thickness is reached in which the deposited layer gives desired electrical properties. For example, a structure incorporating the deposited layer may have a Schottky barrier height (SBH) of about 0.11 eV or less. In some embodiments, the desirable thickness will be a thickness considered thick enough to completely cover a channel area of the substrate surface. In some embodiments, the desirable thickness is a thickness sufficient to substantially prevent oxidation of the underlying channel material of the substrate, such as during subsequent processing. In some embodiments, the desirable thickness is a thickness sufficient to act as a dielectric in a MIS structure.

In some embodiments, the deposited metal chalcogenide comprises at least about 5 at-% of a chalcogen, preferably more than about 15 at-% of a chalcogen and more preferably more than about 30 at-% of a chalcogen and most preferably more than about 40 at-% of a chalcogen. Depending on the metal oxidation state the metal chalcogenide may comprise chalcogen from about 45 at-% to about 75 at-%.

In some embodiments, such as where the metal chalcogenide thin film is incorporated into a three-dimensional architecture, the chosen metal may be selected based on, for example, the substrate and/or the metal layer used in the architecture. For example, in some embodiments it is desirable that the metal chalcogenide thin film utilize a metal that is distinct from the metals present in an overlying and/or underlying layer.

Geometrically challenging applications are also possible due to the nature of the ALD-type processes. The substrate surface may comprise one or more three-dimensional structures. In some embodiments one or more structures may have an aspect ratio of 1:1 to 10:1 or greater.

The thickness of the film formed according to some embodiments is equal to about 0.1 nm and less than or equal to about 5 nm; however, the actual thickness chosen may depend on the intended application of the thin film. In some embodiments, the thickness will be between about 0.1 nm and about 3 nm. In some embodiments, the thickness will be between about 1 nm and about 3 nm. In some embodiments, the thickness is between about 2 nm and about 3 nm. On the other hand, in some applications a thickness greater than 5 nm, 10 nm, or even 20 nm is desirable.

ALD type processes are based on controlled, self-limiting surface reactions and can provide precise control of the film composition. Gas phase reactions are typically avoided by contacting the substrate alternately and sequentially with reactants. Vapor phase reactants are separated from each other in the reaction chamber, for example, by removing excess reactants and/or reactant byproducts from the reaction chamber between reactant pulses. Removing excess reactants and/or reactant byproducts may be achieved, for example, by purging the reaction space after each pulse of reactant gas using a vacuum and/or a purge gas. A purge gas may also be flowed continuously before, during, and after each pulse of reactant gas. For example, in some embodiments the purge gas may also serve as a carrier gas for one or more of the reactants.

Briefly, a substrate is loaded into a reaction chamber and is heated to a suitable deposition temperature, generally at lowered pressure. In some embodiments, the substrate surface on which deposition is to take place comprises silicon. In some embodiments the substrate surface on which deposition is to take place comprises germanium. In some embodiments, the substrate surface comprises one or more III-V materials. In some embodiments, the substrate surface on which deposition is to take place comprises a high-mobility material. In some embodiments, the substrate surface comprises InGaAs. Other suitable substrate surfaces include, GaAs, InP, InAs, and GaSb. In some embodiments the substrate surface may comprise a 2D material such as MoS or graphene. In some embodiments the substrate may be a 300 mm or a 450 mm wafer. In some embodiments, the substrate surface comprises multiple materials, such as one or more III-V materials, silicon, silicon oxide, silicon nitride, $Si_xGe_{1-x}$ or Ge. For example, in some embodiments, the substrate may be a semiconductor wafer, or may be a semiconductor wafer having overlying conductive and/or dielectric materials. In some embodiments, the substrate may be a silicon wafer containing one or more of a germanium layer, a silicon germanium layer, and a III-V semiconductor layer. Thus, substrate surface may include silicon, germanium, silicon and germanium, or a III-V or II-VI semiconductor or a 2D material such as MoS or graphene. The III-V semiconductor may contain Ga and As.

Deposition temperatures are maintained below the precursor thermal decomposition temperature but at a high enough level to avoid condensation of reactants and to provide the activation energy for the desired surface reactions. Of course, the appropriate temperature window for any given ALD reaction will depend upon the surface termination and reactant species involved. The reaction temperature may be from about room temperature to about 500° C. or from about 20° C. to about 500° C. In some embodiments, the reaction temperature is from about room temperature to about 400° C. In some embodiments, the reaction temperature is from about 150° C. to about 400° C., from about 200° C. to about 350° C., or from about 250° C. to about 300° C.

The reaction pressure may be from about 0.1 Torr to about 760 Torr. In some embodiments, the reaction pressure may be from about 0.5 Torr to about atmospheric pressure.

In some embodiments, at least one ALD cycle is used to form a metal chalcogenide thin film. The film formed according to some embodiments is equal to about 0.1 nm and less than or equal to about 5 nm; however, the actual thickness chosen may depend on the intended application of the thin film. In some embodiments, the thickness will be between about 0.1 nm and about 3 nm. In some embodiments, the thickness will be between about 1 nm and about 3 nm. In some embodiments, the thickness is between about 2 nm and about 3 nm. On the other hand, in some applications a thickness greater than 5 nm, 10 nm, or even 20 nm is desirable. In some embodiments it may be desirable to form films with certain number of deposition cycles, such from about 5 deposition cycles to about 20 deposition cycles, preferably from about 7 cycles to about 15 cycles, instead of a target thickness As mentioned above, each pulse or phase of each cycle is preferably self-limiting. An excess of reactant is supplied in each phase to saturate the susceptible structure surfaces. Surface saturation ensures reactant occupation of all available reactive sites (subject, for example, to physical size or "steric hindrance" restraints) and thus provides excellent step coverage. In some arrangements, the degree of self-limiting behavior can be adjusted by, e.g., allowing some overlap of reactant pulses to trade off deposition speed (by allowing some CVD-type reactions) against conformality. Ideal ALD conditions with reactants well separated in time and space provide self-limiting behavior and thus maximum conformality. In some embodiments, less than a complete monolayer is deposited in one or more cycles, for example due to steric hindrance. In some embodiments, more than one monolayer may be deposited by, for example, adjusting the conditions to achieve some decomposition reaction, such as would occur in CVD or CVD-like processes. Limited CVD reactions mixed with the self-limiting ALD reactions can raise the deposition rate.

Examples of suitable reactors that may be used include commercially available ALD equipment such as the F-120® reactor, Pulsar® reactor and Advance® 400 Series reactor, available from ASM America, Inc of Phoenix, Ariz. and ASM Europe B.V., Almere, Netherlands. In addition to these ALD reactors, many other kinds of reactors capable of ALD growth of thin films, including CVD reactors equipped with appropriate equipment and means for pulsing the precursors can be employed. In some embodiments a flow type ALD reactor is used.

In some embodiments the reactor is a batch reactor and has more than about 50 substrates, more than about 100 substrates or more than about 125 substrates. In some embodiments the reactor is a mini-batch reactor and has from about 2 to about 20 substrates, from about 3 to about 15 substrates or from about 4 to about 10 substrates.

The metal chalcogenide ALD processes described herein can optionally be carried out in a reactor or reaction space connected to a cluster tool. In a cluster tool, because each reaction space is dedicated to one type of process, the temperature of the reaction space in each module can be kept constant, which improves the throughput compared to a reactor in which is the substrate is heated up to the process temperature before each run.

A stand-alone reactor can be equipped with a load-lock. In that case, it is not necessary to cool down the reaction space between each run.

Preferably, for forming metal chalcogenide films, each ALD cycle comprises at least two distinct phases. The provision and removal of a reactant from the reaction space may be considered a phase. For a metal deposition cycle, in a first metal phase, a first reactant comprising a suitable metal—such as magnesium, strontium, beryllium, calcium, barium, nickel, zinc, cadmium, or indium—is provided and forms no more than about one monolayer on the substrate surface. This reactant is also referred to herein as "the metal precursor," "metal reactant," or "metal source chemical" and may be, for example, the corresponding beta-diketonate precursors and cyclopentadienyl-based precursors of the metals listed above. In a second chalcogen phase, a second reactant comprising a chalcogen is provided and may convert adsorbed metal reactant to a metal chalcogenide. This reactant is also referred to herein as "the chalcogen precursor," "chalcogen reactant," or "chalcogen source chemical" and may be, for example, an ammonium chalcogenide, for example $(NH_4)_2S$, $(NH_4)_2Se$, or $(NH_4)_2Te$, an aqueous solution of an ammonium chalcogenide, or a hydrogen chalcogenide, for example $H_2S$, $H_2Se$, or $H_2Te$. One or more of the reactants may be provided with the aid of a carrier gas, such as $N_2$, Ar, or He. Additional phases may be added and phases may be removed as desired to adjust the composition of the final film.

The terms "first" and "second" may be applied to any particular precursor depending on the sequencing of any particular embodiment. For example, depending on the embodiment the first reactant can be either a metal precursor or a chalcogen precursor.

FIG. 1 illustrates an embodiment of a method for forming a metal chalcogenide thin film by an ALD-type process comprising multiple pulsing cycles 100, at least one cycle comprising:

contacting the surface of a substrate with a vaporized first metal precursor at step 120 to form at most a molecular monolayer of the metal precursor on the substrate, removing excess metal precursor and reaction byproducts, if any, at step 130 contacting the surface of a substrate with a second chalcogen precursor at step 140, removing excess second chalcogen precursor and any gaseous byproducts formed in the reaction between the metal precursor layer on the substrate and the second reactant at step 150, and optionally repeating the contacting and removing steps at step 160 until a metal chalcogenide thin film of the desired thickness has been formed.

Removing excess precursor and reaction byproducts, if any, may comprise purging the reaction chamber with the use of a purge gas and/or the application of a vacuum to the reaction space. Where a purge gas is used, the purge gas may flow continuously or may be flowed through the reaction space only after the flow of a reactant gas has been stopped and before the next reactant gas begins flowing through the reaction space. It is also possible to continuously flow a purge or non-reactive gas through the reaction chamber so as to utilize the non-reactive gas as a carrier gas for the various reactive species. Thus, in some embodiments, a gas, such as nitrogen, continuously flows through the reaction space while the metal and chalcogen precursors are pulsed as necessary into the reaction chamber. Because the carrier gas is continuously flowing, removing excess reactant or reaction by-products is achieved by merely stopping the flow of reactant gas into the reaction space.

According to some embodiments, a metal chalcogenide thin film is formed by an ALD-type process comprising multiple pulsing cycles, each cycle comprising:

alternately and sequentially contacting the substrate with a vapor phase first metal precursor and a second vapor phase chalcogen precursor until a metal chalcogenide thin film of the desired thickness has been formed.

In some embodiments, the ratio of metal precursor pulses to chalcogen precursor pulses is adjusted. Thus, in some embodiments, a metal precursor is pulsed into the reaction chamber more than once relative to the pulse of the chalcogen precursor in at least one cycle. And in some embodiments, the chalcogen precursor is pulsed into the reaction chamber more than once relative to the pulse of the metal precursor in at least one cycle. For example, if increasing the amount of metal in the film is desired, at least one ALD cycle, every other ALD cycle, or every third, fourth, fifth, sixth cycle, etc. could include one or more additional metal precursor pulses. Similarly, if increasing the amount of chalcogenide in the film is desired, at least one ALD cycle, every other ALD cycle, or every third, fourth, fifth, sixth cycle, etc. could include one or more additional chalcogen precursor pulses.

In some embodiments, it is desirable to incorporate at least two metals into a metal chalcogenide film. Thus, in an appropriate ALD cycle, one or more cycles may include a pulse of a second, third, or fourth metal in addition to or in lieu of the first metal. For example, in some embodiments, the metal chalcogenide film comprises aluminum and magnesium. In some embodiments, the metal chalcogenide film comprises silicon and magnesium. In some embodiments, the metal chalcogenide film comprises hafnium and magnesium. For example, pulses of Al and Mg may be used in combination with chalcogen precursor pulses to form AlMgS, AlMgSe, or AlMgTe. Similarly, Si and Mg pulses or Si and Hf pulses may be used in combination with chalcogen precursor pulses to form MgSiS, MgHfS, MgSiSe, MgHfSe, MgSiTe, or MgHfTe. Without being tied to any particular, it is believed the use of more than one metal may achieve particular benefits, such as suppressed crystallization at elevated temperatures, minimized hygroscopic characteristics, and/or enhanced dielectric constants.

In some embodiments, metal chalcogenides are formed that consist essentially of metal and a chalcogen. In some embodiments, additional reactants may be used to incorporate into or contribute other materials to the film, for example oxygen to form metal oxychalcogenides. In some embodiments where additional non-metal elements in addition to a chalcogen are desired, an ALD process for forming the metal chalcogenide thin film may comprise phases in addition to the initial metal and chalcogen phases. For example, they may include an oxidation phase where metal oxychalcogenides are desired. In an oxidation phase, oxygen or an oxygen-containing precursor is provided in the reaction chamber and allowed to contact the substrate surface. The oxygen phase may be part of one or more deposition cycles. In some embodiments, a separate nitrogen phase may be included in one or more deposition cycles. In some embodiments a second metal phase may be provided in one or more deposition cycles. The oxidation phase, or other desirable phase, may follow the metal phase or the chalcogen phase, but in either situation, it is desirable in some embodiments, to remove excess oxygen (or other reactant) and any reaction by-products from the reaction space before proceeding to the next phase. In some embodiments an additional phase, such as an oxygen, nitrogen or additional metal phase may be provided after the final deposition cycle, or intermittently in the deposition process.

According to some embodiments, a desirable metal chalcogenide of the present disclosure will include one or more metals and at least one element (such as oxygen or nitrogen) in addition to a chalcogenide. Thus, ternary and quaternary compositions would serve as suitable metal chalcogenides. Examples include, but are not limited to, MgHfOS, MgHfSe, MgHfTe, MgSN, MgSeN, MgTeN, MgSO, MgSeO, MgTeO, etc.

Referring again to FIG. 1, which illustrates an exemplary metal chalcogenide deposition process 100, some embodiments may include a pretreatment process at step 110 applied to the substrate surface. A pretreatment may comprise one or more steps. In the pretreatment, the substrate surface on which the metal chalcogenide is to be deposited may be exposed to one or more pretreatment reactants and/or to specific conditions, such as temperature or pressure. A pretreatment may be used for any number of reasons including to clean the substrate surface, remove impurities, remove native oxide, and provide desirable surface terminations. In some embodiments, a pretreatment comprises exposing the substrate surface to one or more pretreatment reactant, such as HCl, HBr, $Cl_2$, HF, an ammonium chalcogenide, or a hydrogen chalcogenide. In some embodiments, a pretreatment process is carried out at about the same temperature as the subsequent deposition process. In some embodiments, a pretreatment process comprises one or more pulses of a suitable chemical, the pulses ranging from about 0.05 s to about 600 s, preferably from about 0.1 s to about 60 s. In some embodiments, the pressure during a pretreatment process is maintained between about 0.01 Torr and about 100 Torr, preferably from about 0.1 Torr to about 10 Torr.

In some embodiments, such as where a III-V material is used, HCl may be used as the pretreatment reactant. In some embodiments, such as where a germanium substrate is used, HF may be used as the pretreatment reactant. In some embodiments, multiple pretreatment reactants are used sequentially or simultaneously. In some embodiments, a pretreatment may involve multiple applications of one or more pretreatment reactants.

In some embodiments, a pretreatment may comprise first exposing the substrate surface to HCl for a period of time and then exposing the substrate surface to a hydrogen chalcogenide for a period of time. Additional steps may also be included. For example, in some embodiments, water may be used to wash the substrate surface between the respective HCl and hydrogen chalcogenide exposures. Thus, in one possible pretreatment, a suitable substrate surface may be exposed to HCl for a period of between 1 s and 5 minutes, washed with deionized (DI) $H_2O$ twice for about a period of between about 1 s and 60 s, and exposed to two exposures of a hydrogen chalcogenide for a period of about 1 s to about 60 s at. The preceding process may occur at any suitable temperature such as between about 100° C. and about 400° C.

According to some embodiments, a pretreatment may comprise an ex-situ wet clean treatment followed by one or more in-situ processes. The in-situ process may comprise multiple stages with different pretreatment reactants. For example, one in-situ sequence could comprise alternating exposure to HCl and a hydrogen chalcogenide, for example $H_2S$, $H_2Se$, or $H_2Te$. Of course, it will be recognized that other combinations or other pretreatment reactants in similar or different combinations may also be used.

In some embodiments, the substrate surface is pretreated with a chalcogen-containing compound. In some embodiments, the chalcogen-containing compound may be the same as or different from the chalcogen precursor used in a subsequent metal chalcogenide deposition process. According to some embodiments, a chalcogen-containing pretreatment agent comprises a chalcogenol with a general formula of R—X—H, wherein R can be an alkane, an alkene, or other carbon-containing group of atoms, and X can be a chalcogen. In some embodiments, the chalcogen-containing pretreatment reactant comprises plasma or radicals derived from chalcogen-containing species. In some embodiments, the pretreatment agent comprises an elemental chalcogen. The use of a pretreatment reactant comprising a chalcogen may provide —XH terminations on the substrate surface, where X is a chalcogen. In such situations, the subsequent exposure to a metal precursor will result in the immediate formation of metal-chalcogen bonds and the beginning of a metal chalcogenide film. In some embodiments, a pretreatment is provided ex situ or in situ and may be provided as a liquid bath or by exposure to a vapor phase of a pretreatment reactant. In some embodiments, the pretreatment process comprises a chalcogen passivation process.

In some embodiments, surface terminations other than chalcogen-H terminations may be desired. In such instances, it may be desirable to use a non-chalcogen-containing pretreatment reactant. For example, in some embodiments, the pretreatment reactant may provide N—H terminations on the substrate surface. In some embodiments, such pretreatments could comprise an $NH_3$ anneal, $N_2$ plasma treatment, or exposure to $N_2H_4$, though other methods and other nitrogen-containing compounds may also be used. Similar to the result that may be achieved using chalcogen-containing pretreatment reactants, the use of nitrogen-containing reactants may achieve N—H terminations on the substrate surface.

A pretreatment process may utilize pretreatment reactants in vapor form and or in liquid form. In some embodiments, the pretreatment process may be carried out at the same temperature and/or pressure as the subsequent deposition process. In some embodiments, the pretreatment process may resemble the subsequent deposition process except that the pretreatment process will involve a longer pulse time or exposure time than used in the subsequent deposition process.

In some specific embodiments, HCl may be used as the pretreatment chemical and may be used in liquid form and the HCl may diluted (e.g., 1 (37%): 10) and may be used in a 1 minute etch. In some specific embodiments, liquid ammonium chalcogenide having a concentration of 22% may be used in a 5 minutes dipping process to pretreat the substrate surface. In some embodiments, the duration of the pretreatment process can be varied broadly without affecting the film properties of the subsequently deposited films.

The pretreatment process may be performed at the same temperature and/or pressure as the subsequent ALD process; however, it may also be performed at a different temperature and/or pressure. In embodiments where the pretreatment is performed ex situ, it may be impossible or undesirable to perform the pretreatment at the same temperature and/or pressure as the subsequent ALD process. For example, where a pretreatment involves the immersion of the substrate in an aqueous solution, it may be desirable to allow the pretreatment to proceed at a higher pressure than the ALD process, which may be performed at relatively low pressures that could undesirably evaporate the pretreatment reactant.

Referring again to FIG. 1, the substrate is contacted with a first metal reactant or precursor at step 120. In some embodiments the first metal precursor is conducted into a reaction chamber in the form of vapor phase pulse and contacted with the surface of the substrate. Conditions are preferably selected such that no more than about one monolayer of the precursor is adsorbed on the substrate surface in a self-limiting manner. The first metal precursor pulse is preferably supplied in gaseous form. The metal precursor gas is considered "volatile" for purposes of the present description if the species exhibits sufficient vapor pressure under the process conditions to transport the species to the workpiece in sufficient concentration to saturate exposed surfaces.

In some embodiments the metal precursor contacts the substrate for about 0.01 seconds to about 60 seconds, for about 0.02 seconds to about 30 seconds, for about 0.025 seconds to about 20 seconds, for about 0.05 seconds to about 5.0 seconds, about 0.05 seconds to about 2.0 seconds or about 0.1 seconds to about 1.0 second.

The metal precursor employed in the ALD type processes may be solid, liquid, or gaseous material under standard conditions (room temperature and atmospheric pressure), provided that the metal precursor is in vapor phase before it is conducted into the reaction chamber and contacted with the substrate surface.

At step 130 excess first reactant and reaction byproducts, if any, are removed from the substrate surface, for example by purging with a pulse of inert gas such as nitrogen or argon. Purging the reaction chamber means that vapor phase precursors and/or vapor phase byproducts are removed from the reaction chamber such as by evacuating the chamber with a vacuum pump and/or by replacing the gas inside the reactor with an inert gas such as argon or nitrogen. Typical purging times are from about 0.05 to 20 seconds, more preferably between about 1 and 10 seconds, and still more preferably between about 1 and 2 seconds. However, other purge times can be utilized if necessary, such as when depositing layers over extremely high aspect ratio structures or other structures with complex surface morphology is needed. The appropriate purging times can be readily determined by the skilled artisan based on the particular circumstances.

In other embodiments however, removing excess first reactant and reaction byproducts, if any, may comprise moving the substrate so that the first reactant no longer contacts the substrate. In some embodiments no reactant may be removed from the various parts of a chamber. In some embodiments the substrate is moved from a part of the chamber containing a first metal precursor to another part of the chamber containing a second reactant or no reactant at all. In some embodiments the substrate is moved from a first reaction chamber to a second, different reaction chamber.

At step 140 the substrate is contacted with a second gaseous, reactant comprising a chalcogen (also referred to as a chalcogen reactant or chalcogen precursor). In some embodiments the chalcogen precursor is pulsed into the chamber where it reacts with the first reactant bound to the surface. The reaction forms up to a monolayer of metal chalcogenide on the substrate surface.

In some embodiments, the chalcogen precursor includes chalcogen plasma or chalcogen radicals. In such embodiments, the chalcogen may be energized within the reaction chamber or upstream of the reaction chamber. Where a plasma is desired, the flow of un-energized chalcogen precursor may comprise a type of purge gas, such that after the substrate has been exposed to a chalcogen plasma for a desired period of time, the plasma generator may be turned off and the flow of chalcogen precursor itself is used to clear the reaction chamber of excess chalcogen plasma and unreacted byproducts.

While one skilled in the art will recognize that any number of suitable chalcogen precursors may be used, appropriate chalcogen precursors include chalcogen containing compounds that favorably react with the ligands of a previously or subsequently deposited metal precursor. Accordingly, selection of an appropriate chalcogen precursor may depend on the specific metal precursor used and the nature of the ligands in the metal precursor In some embodiments the chalcogen precursor contacts the substrate for about 0.01 seconds to about 60 seconds, for about 0.02 seconds to about 30 seconds, for about 0.025 seconds to about 20 seconds, for about 0.05 seconds to about 5.0 seconds, about 0.05 seconds to about 2.0 seconds or about 0.1 seconds to about 1.0 second. However, depending on the reactor type, substrate type and its surface area, the chalcogen precursor contacting time may be even higher than 10 seconds. In some embodiments, contacting times can be on the order of minutes. The optimum contacting time can be readily determined by the skilled artisan based on the particular circumstances.

The concentration of the chalcogen precursor in the reaction chamber may be from about 0.01% by volume to about 99.0% by volume. And the chalcogen precursor may flow through the reaction chamber at a rate of between about 1 standard $cm^3$/min and about 4000 standard $cm^3$/min.

In some embodiments, the growth rate of the metal chalcogenide material is between about 0.01 Å/cycle and about 2.0 Å/cycle. In some embodiments, the growth rate is between about 0.1 Å/cycle and about 1.0 Å/cycle. In some embodiments, the growth rate is about 0.2 Å/cycle.

At step 150, excess second reactant and gaseous byproducts of the surface reaction, if any, are removed from the substrate surface, as described above for step 130. In some embodiments excess reactant and reaction byproducts are preferably removed with the aid of an inert gas.

The steps of contacting and removing may be optionally repeated at step 160 until a metal chalcogenide thin film of the desired thickness has been formed on the substrate, with each cycle leaving no more than a molecular monolayer. In some cases, it might be desirable to achieve at least partial decomposition of at least one the various precursors.

The metal chalcogenide ALD processes of the present disclosure may comprise one or more cycles. Some embodiments involve the repetition of at least about 5 cycles, at least about 10 cycles, or at least about 50 cycles. In some embodiments, no more than 100 cycles are performed to form a thin film of a desirable thickness.

Additional reactants can also be supplied that, in some embodiments, do not contribute elements to the growing film. Such reactants can be provided either in their own pulses or along with the metal and/or chalcogen precursor pulses. The additional reactants can be used, for example, to provide a desired surface termination, or to strip or getter ligands from one or more of the reactants and/or free by-product.

In some embodiments, additional reactants are used in order to contribute additional species, such as oxygen or nitrogen, to the growing thin film. In some embodiments, the additional reactants may be provided in the same phase as another precursor, such as during the metal phase or the chalcogen phase. In some embodiments, the additional reactant or reactants constitute their own phase or phases and are provided separate from both the metal and chalcogen phases. Whether provided with another phase or separately, the additional reactant(s) may be provided in every cycle, some cycles, or only in one cycle in the deposition process.

In some embodiments, one or more additional non-metal elements may be desired in the metal chalcogenide film, such as nitrogen or oxygen. Additional phases can be incorporated in one or more deposition cycles, or provided after deposition of the metal chalcogenide film, in order to incorporate such materials. For example, in some embodiments one or more cycles may include a nitrogen phase in which the substrate is exposed to a nitrogen reactant. In some embodiments, the nitrogen phase incorporates at least some nitrogen into the metal chalcogenide thin film. In some embodiments, the nitrogen phase comprises exposing the substrate surface or growing film to $N_2$ plasma. In some embodiments, the nitrogen phase comprises subjecting the substrate surface or growing film to an annealing process using $NH_3$. In some embodiments, the nitrogen phase comprises subjecting the substrate surface or growing film to $N_2H_4$. In some embodiments, the nitrogen phase comprises exposing the substrate to nitrogen precursors, nitrogen radicals, atomic nitrogen, nitrogen plasma, or combinations thereof. A nitrogen phase can be included in one or more deposition cycles by providing a pulse of the nitrogen reactant and purging or after depositing some or all of the complete film. In some embodiments the nitrogen phase may follow the metal phase or the chalcogen phase in one or more deposition cycles.

In some embodiments one or more cycles may include an oxygen phase in which the substrate is exposed to an oxygen reactant. In some embodiments, the oxygen phase incorporates at least some oxygen into the metal chalcogenide thin film. In some embodiments, the oxygen phase comprises exposing the substrate surface or growing film to oxygen plasma. In some embodiments, the oxygen phase comprises subjecting the substrate surface or growing film to an annealing process in an oxygen atmosphere. In some embodiments, the oxygen phase comprises exposing the substrate to oxygen precursors, oxygen radicals, atomic oxygen, oxygen plasma, or combinations thereof. An oxygen phase can be included in one or more deposition cycles by providing a pulse of the oxygen reactant and purging or after depositing some or all of the complete film. In some embodiments the oxygen phase may follow the metal phase or the chalcogen phase in one or more deposition cycles.

The metal chalcogenide thin films of the present disclosure can include any number of metals. Accordingly, suitable metal precursors comprising the desired metal of the metal chalcogenide can be selected. In some embodiments a metal chalcogenide comprising Be, Mg, Ca, Ba, Sr, Y, Sc, La, Ce, Pr, Nd, Pm, Sm, Eu, Gd, Tb, Dy, Ho, Er, Tm, Yb, Lu, Al, Si, Ni, Zn, Cd, Pb, In, Ga, Ge, Gd, Ta, Mo, or W is formed.

According to some embodiments, a metal chalcogenide thin film includes two or more metals. In some embodiments, additional deposition phases are added to one or more deposition cycles to incorporate the additional metal or metals. The additional metal phase(s) may follow the first metal phase or follow the chalcogen phase. In some embodiments two or more different metal precursors may be provided simultaneously in the same metal phase of a deposition cycle. In some embodiments metal precursors comprising different metals may be used in different deposition cycles. For example, a first metal precursor may be the only metal precursor used in one or more deposition cycles and a second metal precursor comprising a second, different metal, may be used in one or more other deposition cycles.

According to some embodiments of a method for forming a metal chalcogenide thin film by an ALD-type process comprises multiple pulsing cycles, at least one cycle comprising:

contacting the surface of a substrate with a vaporized magnesium precursor, for example $Mg(Cp)_2$, to form at most a molecular monolayer of magnesium precursor on the substrate, removing excess magnesium precursor and reaction byproducts, if any, contacting the surface of a substrate with a second sulfur precursor, for example $H_2S$, removing excess second sulfur precursor and any gaseous byproducts formed in the reaction between the magnesium precursor layer on the substrate and the second reactant, and optionally repeating the contacting and removing steps until a metal chalcogenide, for example magnesium sulfide thin film of the desired thickness has been formed.

According to some embodiments, a metal chalcogenide thin film is formed by an ALD-type process comprising multiple pulsing cycles, each cycle comprising:

alternately and sequentially contacting the substrate with a vapor phase first magnesium precursor, for example $Mg(Cp)_2$, and a second vapor phase sulfur precursor, for example $H_2S$, until a metal chalcogenide, for example magnesium sulfide thin film of the desired thickness has been formed.

According to some embodiments of a method for forming a metal chalcogenide thin film by an ALD-type process comprises multiple pulsing cycles, at least one cycle comprising:

contacting the surface of a substrate with a vaporized strontium precursor, for example $Sr(Cp)_2$, to form at most a molecular monolayer of strontium precursor on the substrate, removing excess strontium precursor and reaction byproducts, if any, contacting the surface of a substrate with a second sulfur precursor, for example $H_2S$, removing excess second sulfur precursor and any gaseous byproducts formed in the reaction between the strontium precursor layer on the substrate and the second reactant, and optionally repeating the contacting and removing steps until a metal chalcogenide, for example strontium sulfide thin film of the desired thickness has been formed.

According to some embodiments, a metal chalcogenide thin film is formed by an ALD-type process comprising multiple pulsing cycles, each cycle comprising:

alternately and sequentially contacting the substrate with a vapor phase first strontium precursor, for example $Sr(Cp)_2$, and a second vapor phase sulfur precursor, for example $H_2S$, until a metal chalcogenide, for example strontium sulfide thin film of the desired thickness has been formed.

Metal Precursors

It will be understood by one skilled in the art that the metal of the metal chalcogenide thin films of the present disclosure may be selected from any number of options. In some embodiments, the metal precursor is selected from compounds containing Be, Mg, Ca, Ba, Sr, Y, Sc, La, Ce, Pr, Nd, Pm, Sm, Eu, Gd, Tb, Dy, Ho, Er, Tm, Yb, Lu, Al, Si, Ni, Zn, Cd, Pb, In, Ga, Ge, Gd, Ta, Mo, and W. In some embodiments, the metal precursor comprises one or more ligands, such as cyclopentadienyl ("Cp") ligands. $MgCp_2$ is one example of a suitable metal precursor. In some embodiments, the metal precursor is a metal beta-diketonate. In some embodiments, the metal precursor is not a cyclopentadienyl-compound of Ca, Ba, or Sr.

In some embodiments, the metal precursor has the following formula:

$$ML_2A_x \qquad (I)$$

wherein each L can be independently selected to be a hydrocarbon group and M can be is Mg, Ca, Ba or Sr and A can be neutral ligand or adduct, such as ethylenediamine or EtOH, and x can be from 0 to 2. Preferably L can be linear, branched, cyclic alkyl or unsaturated hydrocarbon group, such as alkenyl, alkynyl, aromatic, cyclopentadienyl, phenyl, cyclooctadienyl, or cycloheptatrienyl group. Preferably M is Mg, Ba, Sr, or Ca. Preferably x is 0. More preferably L is cyclopentadienyl group. In some embodiments, the L can be a bidentate ligand, such as betadiketonate, guanidinate or amidinate. In some embodiments, the betadiketonate ligand can be acetylacetonate or 2,2,6,6-tetramethyl-3,5-heptanedionato (thd).

In some embodiments, the metal precursor is a cyclopentadienyl compound or derivated thereof, such as alkylsubstituted cyclopentadienyl compound and have the following formula:

$$M(R_1R_2R_3R_4R_5Cp)_2 \qquad (II)$$

wherein each of the $R_1$-$R_5$ can be independently selected to be hydrogen or substituted or unsubstituted alkyl group and M can be is Be, Mg, Ca, Ba or Sr. In preferred embodiments the M is Mg and each of the $R_1$-$R_5$ can be independently selected to be $R_1$-$R_5$ can be hydrogen or linear or branched $C_1$-$C_5$ alkyl group. In more preferred embodiments the M is Mg or Sr and each of the $R_1$-$R_5$ can be independently selected to be hydrogen or $C_1$-$C_3$ alkyl group, such as methyl, ethyl, n-propyl or i-propyl group. In preferred embodiments the precursor is $Mg(Cp)_2$ or $Sr(Cp)_2$.

In some embodiments, the metal precursor comprises one or more ligands, such as cyclopentadienyl ("Cp") ligands. These source compounds can be selected from a group consisting of the following compounds:

$$(Cp)_xM \qquad (III);$$

$$(Cp)_xL_yM \qquad (IV);$$

$$(Cp)_xW_nM \qquad (V);$$

$$(CP)_xL_yW_nM \qquad (VI);$$

wherein M is Sc, Y, La, Ce, Pr, Nd, Sm, Eu, Gd, Tb, Dy, Ho, Er, Tm, Yb or Lu;

Cp is a cyclopentadienyl or a cyclooctadienyl group, so that Cp groups in chemical formulas I-IV can be the same with each other or different from one other; x denotes the number of the Cp ligands and it is an integer from 1 up to the oxidation state of M;

$L_y$ is a neutral adduct ligand that bounds from one or more of its atoms to the rare earth metal and where y denotes the number of the bound ligands; and W is some other ligand with a valence of −1 than Cp and where n denotes the number of the ligands. W is preferably beta-diketonate or its corresponding sulfur or nitrogen compound, halide, amide, alkokside, carboxylate or Schiffs base. It must be noted that cyclooctadiene is usually shortened as Cod, but here the presentation is simplified by the use of the single common abbreviation Cp for both cyclopentadienyl and cyclooctadienyl.

In the chemical equations I-IV, the cyclopentadienyl and/or cyclooctadienyl groups can be in the same molecule, so that there is a bridge between two Cp-groups consisting of a substituted or unsubstituted $C_1$-$C_6$ chain that may contain a heteroatom selected from Si, N, P, Se, S or B.

L is preferably
  (i) a hydrocarbon,
  (ii) a hydrocarbon that contains oxygen,
  (iii) a hydrocarbon that contains nitrogen,
  (iv) a hydrocarbon that contains sulfur,
  (v) a hydrocarbon that contains phosphor,
  (vi) a hydrocarbon that contains arsenic,
  (vii) a hydrocarbon that contains selenium and/or
  (viii) a hydrocarbon that contains tellurium L is more preferably
  (a) amine or polyamine,
  (b) bipyridine,
  (c) a ligand according to a chemical equation

wherein G is —O—, —S—, or —NR$^1$, where R$^1$ is hydrogen or substituted or unsubstituted, cyclic, linear or branched, alkyl, alkenyl, aryl, alkylaryl, arylalkyl, alkoxy, thio, cyano or silyl group. A cyclic or aromatic ring in R$^1$ may contain a heteroatom. Hydrogen or R$^1$-type substituent may also be attached to the carbon atoms in chemical equation V, or
  (d) ether or thioether.

Cyclopentadienyl or cyclooctadienyl group Cp in chemical formulas I-IV has a form:

$$Cp'R_mH_{a-m} \quad (VII)$$

wherein m is an integer 0-8, when a is 8 and m is an integer 0-5 when a is 5,
Cp' is fusioned or isolated cyclopentadienyl or cyclooctadienyl and
R is a hydrocarbon fragment continuing 1-20 carbon atoms, preferably $C_1$-$C_6$ hydrocarbon.

R ligands can be the same with each other or different from one other. R can be a substituted or unsubstituted, cyclic, linear or branched, alkyl alkenyl, aryl, alkylaryl, arylalkyl, alkoxy, tbio, amino, cyano or silyl group. The cyclic or aromatic ring of the substituent may contain a hetero atom. Examples of the substituents are methyl, ethyl, propyl and isopropyl groups.

Neutral adduct ligands L shown in chemical equations II and IV can be ethers, amines or solvent molecules such as tetrahydrofurane that form a bond to the metal with one atom. Examples of suitable neutral adduct ligands that form a bond to a metal with several atoms are polyethers and polyamines.

In some embodiments, the metal precursor does not comprise cesium. However, cesium may comprise a component of the metal precursor in other embodiments. In some embodiments, the metal precursor does not comprise strontium and/or barium. However, strontium and/or barium may comprise a component of the metal precursor in other embodiments. In some embodiments, the metal precursor does not comprise calcium.

In some embodiments, the metal precursor is selected such that the metal of the metal precursor is distinct from any metal that may be present in the underlying substrate. For example, the metal precursor may be selected so as to provide a metal that is distinct from a metal in an underlying semiconductor. Thus, in some embodiments, the metal precursor specifically does not comprise Ga, As, In, Sb, etc. depending on the type of semiconductor or underlying substrate that is used. However, in some embodiments, the metal of the metal precursor may also be found in one or both the underlying semiconductor and the overlying metal layer.

Chalcogen Precursors

It will be understood by one skilled in the art that any number of chalcogen precursors may be used. In some embodiments, the chalcogen precursor is selected from the following list: $H_2S$, $H_2Se$, $H_2Te$, $(NH_4)_2S$, $(NH_4)_2Se$, $(NH_4)_2Te$, dimethylsulfoxide, dimethylselenide, dimethyltelluride, elemental or atomic S, Se, Te, other precursors containing chalcogen-hydrogen bonds, such as $H_2S_2$, $H_2Se_2$, $H_2Te_2$, or chalcogenols with the formula R-chalcogen-H, wherein R can be a substituted or unsubstituted hydrocarbon, preferably a $C_1$-$C_8$ alkyl group, more preferably a linear or branched $C_1$-$C_5$ alkyl group. Suitable chalcogen precursors may include any number of chalcogen-containing compounds so long as they include at least one chalcogen-hydrogen bond. In some embodiments, the chalcogen precursor may comprise a chalcogen plasma or chalcogen radicals. In some embodiments where energized chalcogen is desired, a plasma may be generated in the reaction chamber or upstream of the reaction chamber.

In preferred embodiments, the chalcogen precursor is selected from the following list: $H_2S$, $H_2Se$, and $H_2Te$.

In some embodiments where $(NH_4)_2S$, $(NH_4)_2Se$, or $(NH_4)_2Te$ is employed, the ammonium chalcogenide may be provided in an aqueous solution. In such embodiments, it may be desirable to provide the chalcogen precursor in shorter pulses so as to reduce the effects that $H_2O$ vapor from the solution may have on the substrate or film growth. However, in some embodiments, the chalcogen precursor itself may comprise oxygen.

According to some embodiments, it is desirable to use an oxy-chalcogenide—generically described as $O_x$-Chalcogen$_y$—or an oxy-chalcogenate—generically described as $O_x$(Chalcogen-$O_4$)$_y$. In some embodiments, an aqueous solution of Chalcogen-$O_x$, such as $SO_4$, $SeO_4$, or $TeO_4$ may be used as the chalcogen precursor.

Integration

The metal chalcogenide thin films of the present disclosure may be used in a variety of semiconductor applications. For example, metal chalcogenide films may be particularly useful as an insulator or dielectric layer in a metal-insulator-semiconductor (MIS) source/drain contact structure for transistors. MIS contact structures formed with a metal chalcogenide dielectric layer may result in a reduction of the Schottky barrier height (SBH) and depinning of the Fermi level. Consequently, MIS contact structures according to some embodiments may have exceptionally low contact resistance.

Figure 2:
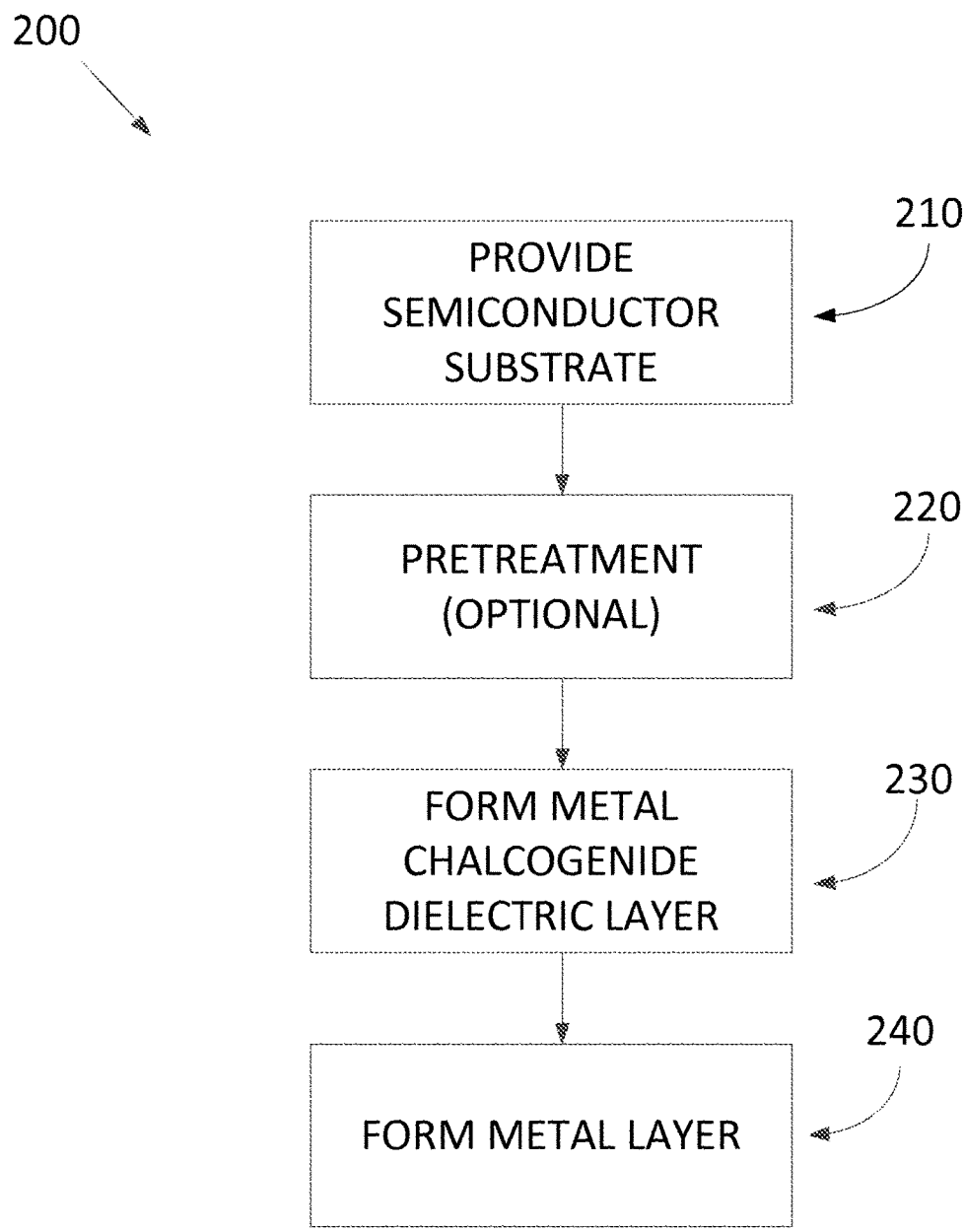
FIG. 2 is a flow chart generally illustrating a process for forming source/drain contact structures according to some embodiments.

FIG. 2 is a flow chart generally illustrating a process 200 for forming source/drain contact structures, according to some embodiments. In some embodiments, the formation of a suitable source/drain contact structure proceeds as follows:

A semiconductor substrate is provided at step 210;

The substrate is optionally subjected to a pretreatment process at step 220;

A suitable metal chalcogenide dielectric layer is formed on a surface of the substrate, for example by an ALD process, at step 230;

A metal layer is formed at step 240 on top of the previously formed layer or layers.

According to some embodiments, at step 210, a substrate comprising a semiconductor is provided. It will be appreciated that the semiconductor may be part of a semiconductor substrate. As used herein, a semiconductor substrate is a substrate that is at least partially formed of semiconductor material. The semiconductor material may be one or more of silicon, germanium, silicon germanium, and a III-V or II-VI semiconductor or a 2D material such as MoS and graphene. For example, in some embodiments, the semiconductor substrate may be a semiconductor wafer, or may be a semiconductor wafer having overlying conductive and/or dielectric materials. In some embodiments, the substrate may be a silicon wafer containing one or more of a germanium layer, a silicon germanium layer, and a III-V semiconductor layer. Thus, the substrate surface may include silicon, germanium, silicon and germanium, or a III-V or II-VI semiconductor or a 2D material such as MoS or graphene. The III-V semiconductor may contain Ga and As.

Preferably, the substrate comprises an exposed semiconductor surface. In some embodiments the substrate comprises the surface of a doped semiconductor region that forms a source/drain region for a transistor. For example, the source/drain region may be formed of an n-doped semiconductor.

FIG. 2 illustrates an optional pretreatment at step 220. A pretreatment may be used for any number of reasons including to clean the substrate surface, remove impurities, remove native oxide, and/or provide desirable surface terminations. In some embodiments, the pretreatment reactant comprises any suitable reducing chemistry. In some embodiments, a pretreatment comprises exposing the substrate surface to pretreatment reactant, which may comprise, for example, an ammonium chalcogenide, a hydrogen chalcogenide, HCl, or HF. The appropriate pretreatment reactant may be selected by the skilled artisan based on the particular circumstances and desired effect.

In some embodiments, such as where the substrate comprises a III-V material, HCl may be used as the pretreatment reactant. An HCl dip may remove the surface contaminants, such as hydrocarbons, particles and metals, but not fully remove the native oxide. HCl concentration may vary, but not limited, from to concentrated about 37 weight-% to dilute 1 weight-%.

In some embodiments, such as where a germanium substrate is used, HF may be used as the pretreatment reactant. HF dip may remove the surface contaminants, such as hydrocarbons, particles and metals, but not fully remove the native oxide. HCl concentration may vary, but not limited, from to concentrated about 50 weight-% to dilute 0.1 weight-%.

In some embodiments, a pretreatment process will utilize both HCl and HF. For example, a substrate surface may be exposed first to an HCl solution and then to an HF solution or vice versa. In some embodiments, the pretreatment process comprises a chalcogen passivation process. In some embodiments the substrate is exposed to a pretreatment reactant comprising a chalcogen. The use of a pretreatment reactant comprising sulfur may provide—chalcogen-H terminations on the substrate surface. In such situations, the subsequent exposure to a metal precursor in the beginning of step 230, such as a magnesium precursor, will result in the immediate formation of metal-chalcogen bonds and the beginning of the metal chalcogenide interface layer. In some embodiments, a pretreatment process may comprise the substrate surface being exposed to a hydrogen chalcogenide.

In some embodiments, surface terminations other than—chalcogen-H terminations may be desired. In such instances, it may be desirable to use a non-chalcogen-containing pretreatment reactant, such as the HF or HCl exposure described above. According to some embodiments, HCl and/or HF may be applied in-situ or in a clustered configuration.

Optional pretreatment 220 may comprise exposure to a liquid reactant, such as by submerging the substrate in a liquid bath or by exposing the substrate to a vapor phase pretreatment reactant. In some cases in-situ HCl or HF pretreatment from gas phase is done without airbreak or exposure to air. In some cases in-situ hydrogen chalcogenide pretreatment from gas phase is done without airbreak or exposure to air.

In some embodiments, pretreatment may comprise changing the temperature and atmosphere, such as hydrogen plasma treatment, $NF_3$ plasma treatment, or thermal $H_2$ bake.

Subsequent to the optional pretreatment step, if performed, a metal chalcogenide electron tunneling barrier layer or dielectric layer is formed at step 230. In some embodiments the metal chalcogenide barrier or dielectric layer is formed or deposited on the substrate provided in step 210. Preferably, the metal chalcogenide dielectric layer is formed on an exposed semiconductor surface. In some embodiments the metal chalcogenide dielectric layer is deposited directly over the semiconductor surface. In some embodiments the semiconductor surface comprises the surface of a doped semiconductor region that forms a source/drain region for a transistor. For example, the source/drain region may be formed of an n-doped semiconductor.

In some embodiments, a metal chalcogenide barrier layer or dielectric layer is a thin film that comprises a suitable metal chalcogenide. Suitable metal chalcogenide includes those where the metal is selected from the following: Be, Mg, Ca, Ba, Sr, Y, Sc, La, Ce, Pr, Nd, Pm, Sm, Eu, Gd, Tb, Dy, Ho, Er, Tm, Yb, Lu, Al, Si, Ni, Zn, Cd, Pb, In, Ga, Ge, Gd, Ta, Mo, and W. In some embodiments, suitable metal chalcogenides includes those where the metal is not selected from the following: Al, Ga, and In. In some embodiments, it is desirable that the metal of the metal chalcogenide film be distinct from the metal of either or both the underlying substrate surface and an overlying layer, such as a subsequently formed conductive layer. In some embodiments, the metal chalcogenide barrier layer or dielectric layer is deposited to be a distinct layer from the substrate, meaning that no material from the substrate is consumed for the metal chalcogenide barrier layer or dielectric layer, except that some bonds may form between the substrate and the metal chalcogenide barrier layer or dielectric layer.

In some embodiments, the metal chalcogenide barrier layer or dielectric layer is deposited to achieve a particular thickness. Suitable thicknesses may be greater than or equal to about 0.1 nm and less than or equal to about 5 nm. In some embodiments, the thickness will be between about 0.1 nm and about 3 nm. In some embodiments, the thickness will be between about 1 nm and about 3 nm. In some embodiments, the thickness is between about 2 nm and about 3 nm. In some embodiments, the suitable thickness will be one that achieves a complete layer over the substrate surface (i.e., one that leaves no gaps). Accordingly, the actual thickness that achieves a complete layer may depend on the type of metal chalcogenide formed and the types of precursors used to achieve the metal chalcogenide.

In some embodiments suitable metal chalcogenide materials include one or more of the following: BeS, MgS, CaS, SrS, BaS, NiS, ZnS, CdS, InS, BeSe, MgSe, CaSe, SrSe, BaSe, NiSe, ZnSe, CdSe, InSe, BeTe, MgTe, CaTe, SrTe, BaTe, NiTe, ZnTe, CdTe, and InTe. Other metal chalcogenides are also possible. For simplicity, these metal chalcogenides have been indicated to have these general stoichiometries. But it will be understood that the exact stoichiometry of any given metal chalcogenide will vary based on the oxidation state of the metal. Accordingly, other stoichiometries are expressly contemplated.

In some embodiments, the deposited metal chalcogenide barrier layer or dielectric layer comprises at least about 5 at-% of a chalcogen, preferably more than about 15 at-% of a chalcogen and more preferably more than about 30 at-% of a chalcogen and most preferably more than about 40 at-% of a chalcogen. Depending on the metal oxidation state the metal chalcogenide interface may comprise a chalcogen from about 45 at-% to about 75 at-%.

In some embodiments a metal chalcogenide barrier layer or dielectric layer is formed by an ALD process as described above. In some embodiments the metal chalcogenide barrier layer or dielectric layer is formed by an ALD type process. In some embodiments the metal chalcogenide barrier layer or dielectric layer is formed by a chemical vapor deposition (CVD) process. CVD-like processes or a combination of ALD and CVD processes may also be used. In some embodiments other processes, such as physical vapor deposition (PVD), plasma-enhanced atomic layer deposition (PEALD) may be used.

In some embodiments the metal chalcogenide barrier layer or dielectric layer may optionally be subjected to a post-deposition treatment process prior to formation of a subsequent layer. For example, once a desired thickness of the metal chalcogenide barrier layer or dielectric layer is achieved, a chalcogen passivation process (or other suitable post deposition treatment, such as an annealing process or a forming gas annealing process) may be carried out, after which a subsequent layers may be formed over the treated barrier layer or dielectric layer.

With continued reference to FIG. 2, at step 240 a metal is deposited on the metal chalcogenide barrier layer or dielectric layer. In some embodiments a metal layer is deposited on the metal chalcogenide dielectric layer. In some embodiments a metal or metal layer is deposited directly over the metal chalcogenide dielectric layer. The metal forms the "M" portion of the MIS-type contact structure and may function as part of an electrical contact with other electronic circuitry. In some embodiments, the metal may be titanium, aluminum, nickel, or combinations thereof, including titanium and aluminum. In some embodiments the metal may comprise at least one of the following: Ti, Al, Zr, Hf, V, Ta, Nb, Cr, Mo, W, Co, TiN, TiC, TiAlC, TaC, TaAlC, NbAlC, TiAl, TaAl, TaN, TaCN, WN, and TiWN. These metals may be deposited by various methods including, for example, vapor deposition processes such as ALD using self-limiting depositions of titanium or aluminum precursors, whether or not activated by a plasma, or physical deposition processes including sputtering and e-beam evaporation. It will be appreciated that other materials may subsequently be deposited. In some embodiments, the metal may be titanium, while titanium nitride (TiN) may subsequently be deposited on the metal layer. As an example, the MIS contact structure may include an n-doped germanium source/drain region (as the "S" portion of the contact structure); a barrier layer or dielectric layer formed by a metal chalcogenide, for example MgS, SrS, BeS, CaS, Bas, NiS, ZnS, CdS, or Is (as the "I" portion of the contact structure); a metal layer formed of titanium (as the "M" portion of the contact structure); and a titanium nitride (TiN) layer over the titanium.

In some embodiments, each of steps 210, 220, 230, and 240 may be performed in the same process chamber, e.g., a single-substrate process chamber. In some other embodiments, steps 220 and 230 may be performed in different chambers, e.g., different chambers in a cluster tool. Advantageously, the metal chalcogenide deposition of step 230 can provide increased process latitude, since the metal chalcogenide barrier layer or dielectric layer can make the substrate surface less sensitive to the external ambient environment outside the process chamber, thereby allowing the substrate to be transported to another process chamber without significant undesired reactions with the external ambient environment. It will be appreciated that transport between dedicated process chambers for specific depositions may facilitate high quality deposition results.

Figure 3:
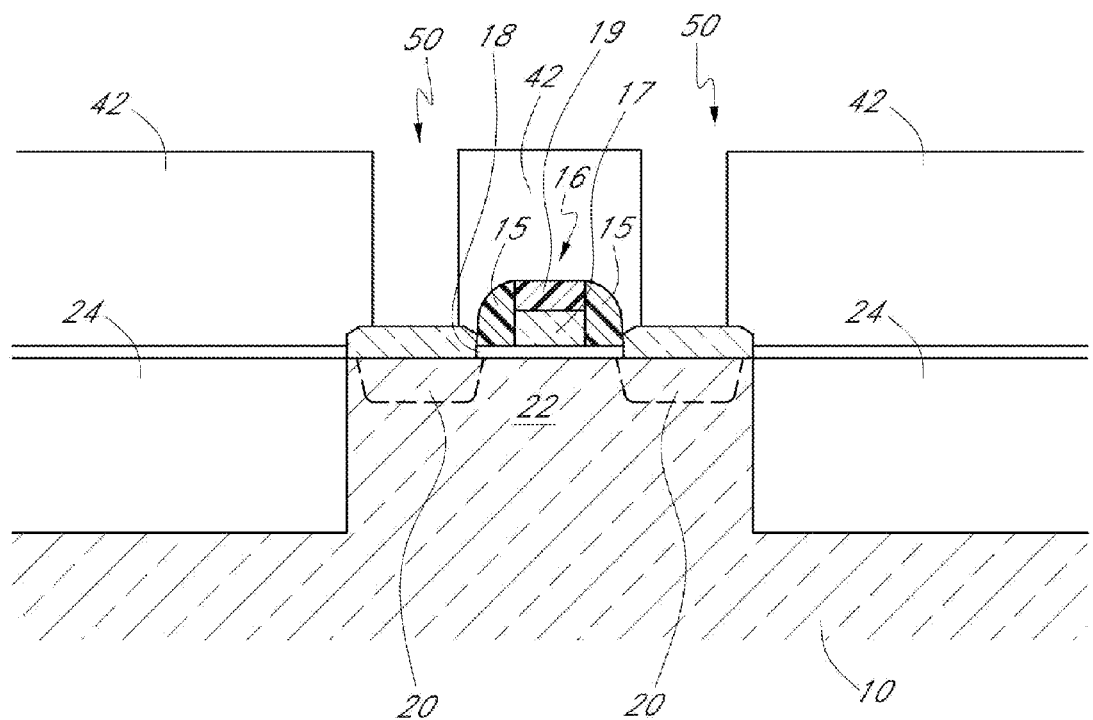
FIG. 3 illustrates a schematic cross-section of a transistor structure before forming a source/drain contact structure, according to some embodiments.

FIG. 3 shows a schematic cross-section of a transistor structure before forming a source/drain contact structure, according to some embodiments. Substrate 10 includes a semiconductor, which can form an active area 22 between field isolation regions 24, which can be formed by conventional shallow trench isolation (STI) techniques, in some embodiments. Alternatively, any suitable method can be used to define the field-insulating material, including local oxidation of silicon (LOCOS), deposition of insulating material, and a number of variations on LOCOS, STI, or insulating material deposition. A single active area 22 is illustrated in FIG. 3. However, it will be understood that several active areas are typically defined simultaneously by STI across the substrate 10, and that field insulation processes often form a web of field isolation regions separating multiple transistor active areas 22 from one another. The substrate is preferably background doped at a level suitable for channel formation in the active area 22.

With continued reference to FIG. 3, a transistor gate electrode 16 is formed over the active area 22. The gate electrode 16 includes a pair of spacers 15 formed around a semiconductor electrode 17, which is covered by a cap layer 19. While illustrated as a traditional semiconductor electrode, surrounded by insulating spacers 15 and a cap layer 19, and separated from the underlying substrate 10 by a gate dielectric layer 18, it will be understood that the transistor gate stack can have any of a variety of configurations. In some process flows, for example, the spacers 15 can be omitted. In the illustrated embodiment, the source/drain regions 20 are formed on either side of the transistor gate electrode 16 within the active area 22. The gate electrode 16 also defines a channel region, in the active area 22, directly under the gate electrode 16 and between the source/drain regions 20. A patterned planarization and tunnel layer 42 (formed, for example, of $SiO_2$) is provided over the gate electrode 16. The layer 42 includes openings 50, which expose the source/drain regions 20.

Figure 4:
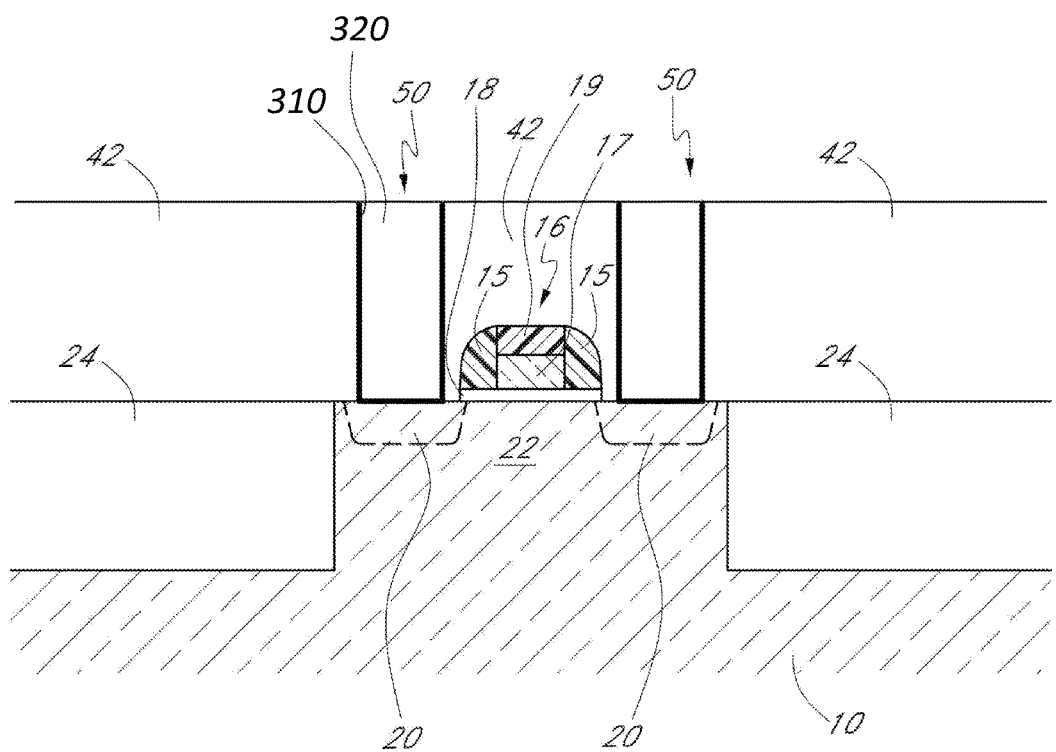
FIG. 4 illustrates a schematic cross-section of the transistor structure of FIG. 3 after forming a source/drain contact structure, according to some embodiments.

FIG. 4 shows a schematic cross section of the transistor structure of FIG. 3 after forming a source/drain contact structure, according to some embodiments. In some embodiments a metal chalcogenide electron tunneling barrier layer or dielectric layer 310 is formed on the surfaces of the openings 50, as described herein with respect to step 230 of FIG. 2. The opening 50 is subsequently filled with a metal 320, as described herein with respect to steps 140 of FIG. 2.

It will be appreciated that the sequences illustrated by FIGS. 3 and 4 are examples for planar device structures only and that other orders for forming the various illustrated features are contemplated. For example, the source/drain contact structure formed by the underlying semiconductor 42, barrier layer or dielectric layer 310, and metal 320 may be formed before one or more of the other illustrated features. In addition, the methods disclosed herein may be applied to other transistor types that utilize a source/drain contact such as non-planar device structures, including Fin-FET and Vertical Nanowire/GAA device structures. It will be appreciated that these other transistor types may omit one or more of the illustrated features and/or include additional features.

Example 1

In this example, a number of metal-insulator-semiconductor (MIS) structures were formed with insulator-semiconductor interfacial layers of various compositions, and the respective Schottky barrier height (SBH) of each structure was measured.

Each MIS structure was formed with an aluminum metal layer, a $TiO_2$ dielectric, or insulator layer, and an n-type Ge semiconductor layer. Interfacial layers of varying compositions were deposited between the n-type Ge layer and the $TiO_2$ layer. In two separate samples, $Mg(Cp)_2$ and $Sr(Cp)_2$ were pulsed through a reaction space in an ALD process with a pulse time of about 30 seconds respectively without a chalcogen precursor. In two other separate samples, $H_2S$ was chosen as a chalcogen precursor. In one sample $Mg(Cp)_2$ and the chalcogen precursor were alternately and sequentially pulsed through a reaction space in an ALD process with a metal precursor pulse times of about 30 seconds and a $H_2S$ pulse time of about 0.1 seconds to about 10 seconds. In a second sample $Sr(Cp)_2$ and the chalcogen precursor were alternately and sequentially pulsed through a reaction space in an ALD process with a metal precursor pulse times of about 30 seconds and a $H_2S$ pulse time of about 0.1 seconds to about 10 seconds. The resulting MIS structures where analyzed to determine the SBH of each sample. The respective results obtained are reproduced in Table 1 below.

TABLE 1

Comparison of Schottky barrier height for various interfacial layer compositions

| Samples | SBH (eV) |
|---|---|
| Al/TiO$_2$/n-Ge with Sr(Cp)$_2$ | 0.24 |
| Al/TiO$_2$/n-Ge with H$_2$S and Sr(Cp)$_2$ | 0.14 |
| Al/TiO$_2$/n-Ge with Mg(Cp)$_2$ | 0.26 |
| Al/TiO$_2$/n-Ge with H$_2$S and Mg(Cp)$_2$ | 0.07 |

Generally, a very high SBH exists for a direct metal contact with a semiconductor surface, for example an Al metal contact on a n-type Ge semiconductor surface. This high SBH causes a high contact resistance between the metal and semiconductor layers. A MIS structure has been proposed to reduce the SBH. A thin insulator, or dielectric positioned between the metal and semiconductor layers can eliminate metal induced gap states and de-pin the Fermi level of the structure. For example, an Al/TiO$_2$/n-Ge MIS structure with a 2.5 nm thick $TiO_2$ insulator layer has an SBH of about 0.18 eV, an Al/TiO$_2$/n-Ge MIS structure with a 1.5 nm thick $TiO_2$ insulator layer has an SBH of about 0.24 eV. Based on the above examples including interfacial layers, it was determined that using an interfacial layer deposited by an ALD type process including an $H_2S$ phase and a $Mg(Cp)_2$ phase, or an interfacial layer deposited by an ALD type process including an $H_2S$ phase and an $Sr(Cp)_2$ phase between the dielectric and semiconductor layers further reduced the SBH of the MIS structure. This lower SBH is beneficial in further reducing the contact resistance, and thereby improving the drive current.

Example 2

In this example, a number of metal-insulator-semiconductor (MIS) structures were formed with insulator-semiconductor interfacial layers of various compositions, and the respective Schottky barrier height (SBH) of each structure was measured.

Each MIS structure was formed with an aluminum metal layer, a $TiO_2$ dielectric, or insulator layer, and an n-type Ge semiconductor layer. Interfacial layers of varying compositions were deposited between the n-type Ge layer and the $TiO_2$ layer. In one sample $Mg(Cp)_2$ was chosen as the metal precursor and $H_2S$ was chosen as the chalcogen precursor. The metal precursor was pulsed through a reaction space with a pulse time of about 3 seconds and a purge time of about 3 seconds, and the chalcogen precursor was pulsed through a reaction space with a pulse time of about 3 seconds and a purge time of about 6 seconds in an ALD process, which was carried out at about 250° C. In another sample, $Mg(Cp)_2$ was pulsed through a reaction space with a pulse time of about 3 seconds and a purge time of about 3 seconds, while no chalcogen precursor was pulsed through a reaction space in an ALD type process at a temperature of about 250° C., this process was repeated for 5 cycles. In another sample $Mg(Cp)_2$ was pulsed through a reaction space with a pulse time of about 3 seconds and a purge time of about 3 seconds, while no chalcogen precursor was pulsed though a reaction space in an ALD type process at a temperature of about 250° C. for 20 cycles.

The resulting MIS structures where analyzed to determine the SBH of each samples. The respective results obtained are reproduced in Table 2 below.

TABLE 2

Comparison of Schottky barrier height for various interfacial layer compositions

| Samples | SBH (eV) |
|---|---|
| Al/TiO$_2$/n-Ge with H$_2$S and Mg(Cp)$_2$ | 0.07 |
| Al/TiO$_2$/n-Ge with 5 cycles Mg(Cp)$_2$ | 0.22 |
| Al/TiO$_2$/n-Ge with 20 cycles Mg(Cp)$_2$ | 0.11 |

Based on the results of this experiment it was determined that a continuous interfacial layer deposited by an ALD type process including an $H_2S$ chalcogen precursor and a $Mg(Cp)_2$ metal precursor significantly reduces the SBH in a MIS structure. This result indicates that a continuous layer deposited by an ALD type process including an $H_2S$ chalcogen precursor and a $Mg(Cp)_2$ metal precursor alone may be used as the dielectric or insulator layer in a MIS structure, without the need for another material, such as $TiO_2$.

What is claimed is:

1. A method of forming a metal-insulator-semiconductor (MIS) source/drain contact structure on a source/drain region of a substrate surface, the method comprising:
   providing a substrate comprising a source/drain region comprising a semiconductor surface;
   depositing a metal chalcogenide thin film directly over the source/drain region; and
   depositing a metal layer over the metal chalcogenide thin film to thereby form the metal-insulator-semiconductor (MIS) source/drain contact structure;
   wherein the metal chalcogenide thin film comprises at least one of the following: BeS, MgS, CaS, SrS, BaS, NiS, ZnS, CdS, InS, BeSe, MgSe, CaSe, SrSe, BaSe, NiSe, ZnSe, CdSe, InSe, BeTe, MgTe, CaTe, SrTe, BaTe, NiTe, ZnTe, CdTe, and InTe; and
   wherein the MIS source/drain contact structure has a Schottky barrier height (SBH) of less than 0.11 eV.

2. The method of claim 1, wherein the metal chalcogenide thin film has a thickness between about 0.1 nm and about 5 nm.

3. The method of claim 1, wherein the metal of the metal chalcogenide thin film comprises at least one of the following: Be, Mg, Ca, Ba, Sr, Y, Sc, La, Ce, Pr, Nd, Pm, Sm, Eu, Gd, Tb, Dy, Ho, Er, Tm, Yb, Lu, Al, Si, Ni, Zn, Cd, Pb, In, Ga, Ge, Gd, Ta, Mo, and W.

4. The method of claim 1, wherein the semiconductor surface comprises silicon, silicon germanium, a group III-V semiconductor, a group II-VI semiconductor, a 2D semiconductor, or combinations thereof.

5. The method of claim 1, wherein the metal layer comprises at least one of the following: Ti, Al, Zr, Hf, V, Ta, Nb, Cr, Mo, W, Co, TiN, TiC, TiAlC, TaC, TaAlC, NbAlC, TiAl, TaAl, TaN, TaCN, WN, and TiWN.

6. The method of claim 1, wherein depositing the metal chalcogenide thin film comprises an atomic layer deposition (ALD) process comprising alternately and sequentially contacting the semiconductor surface with a metal precursor and a chalcogen precursor.

7. A method of forming a metal-insulator-semiconductor (MIS) source/drain contact structure on a source/drain region of a substrate comprising a semiconductor surface, the method comprising:
   forming a metal chalcogenide thin film on the source/drain region of the semiconductor surface by an atomic layer deposition (ALD) process comprising alternately and sequentially contacting the substrate surface with a metal precursor and a chalcogen precursor;
   wherein the chalcogen precursor is selected from at least one of the following: elemental S, elemental Se, elemental Te, S plasma, Se plasma, Te plasma, $H_2S$, $H_2Se$, $H_2Te$, $(NH_4)_2S$, $(NH_4)_2Se$, and $(NH_4)_2Te$;
   wherein the metal chalcogenide thin film comprises at least one of the following: BeS, MgS, CaS, SrS, BaS, NiS, ZnS, CdS, InS, BeSe, MgSe, CaSe, SrSe, BaSe, NiSe, ZnSe, CdSe, InSe, BeTe, MgTe, CaTe, SrTe, BaTe, NiTe, ZnTe, CdTe, and InTe; and
   forming a metal layer over the metal chalcogenide thin film to thereby form a metal-insulator-semiconductor (MIS) source/drain contact structure,
   wherein the MIS source/drain contact structure has a Schottky barrier height (SBH) of less than 0.11 eV.

8. The method of claim 7 wherein the metal precursor comprises a cyclopentadienyl ligand.

9. The method of claim 8, wherein the metal precursor comprises $Mg(Cp)_2$ or $Sr(Cp)_2$.

10. The method of claim 7, further comprising subjecting the substrate surface to a pretreatment process prior to forming a metal chalcogenide thin film on the substrate surface using an ALD process, wherein the pretreatment process comprises exposing the substrate surface to at least one of the following: HCl, HF, HBr, $Cl_2$, HF, $H_2S$, $H_2Se$, $H_2Te$, $(NH_4)_2S$, $(NH_4)_2Se$, and $(NH_4)_2Te$.

11. The method of claim 8, wherein the metal chalcogenide thin film has a thickness between 0.1 nm and 5 nm.

12. A method for integrated circuit fabrication, comprising:
   forming a metal chalcogenide dielectric layer directly over a source/drain region of a semiconductor substrate by alternately and sequentially contacting the substrate surface with a metal precursor and a chalcogen precursor, wherein the metal chalcogenide dielectric layer comprises at least one of the following: BeS, MgS, CaS, SrS, BaS, NiS, ZnS, CdS, InS, BeSe, MgSe, CaSe, SrSe, BaSe, NiSe, ZnSe, CdSe, InSe, BeTe, MgTe, CaTe, SrTe, BaTe, NiTe, ZnTe, CdTe, and InTe; and
   forming a metal electrode over the dielectric layer to thereby form a metal-insulator-semiconductor (MIS) source/drain contact structure,
   wherein a Schottky barrier height (SBH) of the MIS source/drain contact structure is less than 0.11 eV.

13. The method of claim 12, wherein the metal chalcogenide dielectric layer comprises at least one of the following materials: MgS, SrS, MgSe, SrSe, MgTe, and SrTe.

14. The method of claim 12, wherein the metal electrode comprises at least one of the following: Ti, Al, Zr, Hf, V, Ta, Nb, Cr, Mo, W, Co, TiN, TiC, TiAlC, TaC, TaAlC, NbAlC, TiAl, TaAl, TaN, TaCN, WN, and TiWN.

15. The method of claim 14, wherein the metal electrode comprises titanium.

16. The method of claim 12, wherein the source/drain region comprises silicon, silicon germanium, a group III-V semiconductor, a group II-VI semiconductor, a 2D semiconductor, or combinations thereof.

17. The method of claim 12, wherein the source/drain region comprises germanium.

18. The method of claim 12, wherein the source/drain region comprises n-doped germanium, and the metal electrode comprises titanium.

19. The method of claim 12, wherein the metal precursor comprises $Mg(Cp)_2$ or $Sr(Cp)_2$, and the chalcogen precursor comprises $H_2S$, $H_2Se$, or $H_2Te$.

20. The method of claim 12, wherein the metal chalcogenide dielectric layer comprises MgS or SrS.

* * * * *

UNITED STATES PATENT AND TRADEMARK OFFICE
CERTIFICATE OF CORRECTION

PATENT NO. : 9,711,396 B2  
APPLICATION NO. : 14/741249  
DATED : July 18, 2017  
INVENTOR(S) : Fu Tang Page 1 of 1

It is certified that error appears in the above-identified patent and that said Letters Patent is hereby corrected as shown below:

On the Title Page

In Column 2 (page 2, item (56)) at Line 52, Under Other Publications, change "Physicas" to --Physics--.

In the Specification

In Column 3 at Line 14, Change "TaAC, NbAC," to --TaAlC, NbAlC,--.

In Column 3 at Line 22, Change "titanium. the" to --titanium. The--.

In Column 3 at Line 26, After "SrS" insert --.--.

In Column 7 at Line 33, After "thickness" insert --.--.

In Column 8 at Line 52, After "130" insert --,--.

In Column 11 at Line 47, Change "and or" to --and/or--.

In Column 17 at Line 4, Change "alkokside," to --alkoxide,--.

In Column 17 at Line 23, After "tellurium" insert --.--.

In Column 17 at Line 56, Change "tbio," to --thio,--.

In the Claims

In Column 26 at Line 16, In Claim 11, change "claim 8," to --claim 7,--.

Signed and Sealed this  
Seventh Day of November, 2017

Joseph Matal  
*Performing the Functions and Duties of the*  
*Under Secretary of Commerce for Intellectual Property and*  
*Director of the United States Patent and Trademark Office*